US012700710B2

(12) United States Patent
Dougakiuchi et al.

(10) Patent No.: US 12,700,710 B2
(45) Date of Patent: Aug. 4, 2026

(54) LASER MODULE

(71) Applicant: HAMAMATSU PHOTONICS K.K., Hamamatsu (JP)

(72) Inventors: Tatsuo Dougakiuchi, Hamamatsu (JP); Akio Ito, Hamamatsu (JP); Kazuue Fujita, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 753 days.

(21) Appl. No.: 18/103,656

(22) Filed: Jan. 31, 2023

(65) Prior Publication Data

US 2023/0253755 A1      Aug. 10, 2023

(30) Foreign Application Priority Data

Feb. 9, 2022      (JP) ................................. 2022-018680

(51) Int. Cl.
| | |
|---|---|
| *H01S 5/02326* | (2021.01) |
| *H01S 3/1055* | (2006.01) |
| *H01S 5/02216* | (2021.01) |
| *H01S 5/02253* | (2021.01) |
| *H01S 5/02315* | (2021.01) |

(Continued)

(52) U.S. Cl.
CPC ........ *H01S 5/02325* (2021.01); *H01S 3/1055* (2013.01); *H01S 5/02216* (2013.01); *H01S 5/02253* (2021.01); *H01S 5/02315* (2021.01); *H01S 5/02326* (2021.01); *H01S 5/0604* (2013.01); *H01S 5/12* (2013.01); *H01S 5/141*

(2013.01); *H01S 5/3402* (2013.01); *H01S 5/0207* (2013.01); *H01S 5/02469* (2013.01);

(Continued)

(58) Field of Classification Search
None
See application file for complete search history.

(56) References Cited

U.S. PATENT DOCUMENTS

| | | | | |
|---|---|---|---|---|
| 5,172,390 A | * | 12/1992 | Mooradian | ............. H01S 5/141 |
| | | | | 372/92 |
| 5,268,922 A | * | 12/1993 | Fouere | ................... G02B 7/028 |
| | | | | 372/98 |

(Continued)

FOREIGN PATENT DOCUMENTS

| | | |
|---|---|---|
| JP | 2002-204020 A | 7/2002 |
| JP | 2017-050308 A | 3/2017 |

(Continued)

*Primary Examiner* — Tod T Van Roy

(74) *Attorney, Agent, or Firm* — Faegre Drinker Biddle & Reath LLP

(57) ABSTRACT

The laser module includes a QCL element, a diffraction grating unit including a movable diffraction grating, a first lens that transmits light emitted from an end surface of the QCL element and light returning from the movable diffraction grating to the QCL element, a second lens that transmits terahertz waves emitted from the QCL element, a first holder, and a package. The first holder has a support surface on which the QCL element is mounted and a side surface connected to the support surface and facing the first lens in a resonance direction. A distance from an intersection point between the side surface and the support surface to the end surface along the resonance direction is smaller than a distance between the intersection point and the first lens along the resonance direction.

19 Claims, 11 Drawing Sheets

(51) Int. Cl.
| | | |
|---|---|---|
| *H01S 5/02325* | (2021.01) | |
| *H01S 5/06* | (2006.01) | |
| *H01S 5/12* | (2021.01) | |
| *H01S 5/14* | (2006.01) | |
| *H01S 5/34* | (2006.01) | |
| *H01S 5/02* | (2006.01) | |
| *H01S 5/024* | (2006.01) | |

(52) U.S. Cl.
CPC ......... *H01S 5/3401* (2013.01); *H01S 2302/02* (2013.01)

(56) References Cited

U.S. PATENT DOCUMENTS

| | | | | |
|---|---|---|---|---|
| 5,448,587 | A * | 9/1995 | Huang ................ | H01S 5/02253 372/65 |
| 6,326,646 | B1 * | 12/2001 | Baillargeon ........ | H01S 5/02375 257/94 |
| 7,466,734 | B1 * | 12/2008 | Day ....................... | B82Y 20/00 372/39 |
| 8,442,081 | B2 * | 5/2013 | Marsland, Jr. ............ | F41G 1/36 372/29.011 |
| 10,574,030 | B2 * | 2/2020 | Edamura ............. | H01S 5/06216 |
| 12,203,645 | B2 * | 1/2025 | Kato ..................... | H01S 5/0222 |
| 12,278,463 | B2 * | 4/2025 | Sugiyama ............... | H01S 5/141 |
| 12,300,968 | B2 * | 5/2025 | Sugiyama ........... | H01S 5/02345 |
| 12,327,976 | B2 * | 6/2025 | Edamura ............... | H01S 5/3402 |
| 2007/0030865 | A1 * | 2/2007 | Day ................... | H01S 5/02216 372/4 |
| 2008/0159341 | A1 * | 7/2008 | Patel ....................... | H01S 5/141 372/102 |
| 2009/0028197 | A1 * | 1/2009 | Arnone .................. | H01S 5/141 372/32 |
| 2010/0002739 | A1 * | 1/2010 | Hu ............................ | H01S 1/02 372/45.01 |
| 2010/0243891 | A1 * | 9/2010 | Day ..................... | G02B 6/4266 372/45.01 |
| 2012/0219022 | A1 * | 8/2012 | Dougakiuchi ......... | B82Y 20/00 372/20 |
| 2015/0311665 | A1 * | 10/2015 | Belkin .................... | G02F 1/365 372/20 |
| 2022/0209505 | A1 * | 6/2022 | Fujita .................... | H01S 5/0207 |
| 2022/0271504 | A1 * | 8/2022 | Sugiyama ............. | H01S 3/1055 |
| 2022/0271505 | A1 * | 8/2022 | Sugiyama ............... | H01S 5/141 |
| 2022/0271506 | A1 * | 8/2022 | Sugiyama ........... | H01S 5/02326 |
| 2023/0087419 | A1 * | 3/2023 | Sugiyama ............... | H01S 5/023 372/9 |
| 2023/0092813 | A1 * | 3/2023 | Sugiyama ............. | H01S 5/3402 372/44.01 |
| 2023/0095425 | A1 * | 3/2023 | Ochiai ................... | G02B 7/021 372/45.01 |
| 2023/0163558 | A1 * | 5/2023 | Ochiai ................. | H01S 5/0064 372/44.01 |
| 2023/0253755 | A1 * | 8/2023 | Dougakiuchi ...... | H01S 5/02216 372/44.01 |
| 2023/0318255 | A1 * | 10/2023 | Hayashi ................ | H01S 5/0607 372/44.01 |
| 2024/0356306 | A1 * | 10/2024 | Ochiai .................... | H01S 5/141 |
| 2024/0356307 | A1 * | 10/2024 | Ochiai .................... | H01S 5/141 |
| 2025/0158352 | A1 * | 5/2025 | Sugiyama ............. | H01S 5/0239 |
| 2025/0219355 | A1 * | 7/2025 | Sugiyama ............... | H01S 5/141 |

FOREIGN PATENT DOCUMENTS

| | | |
|---|---|---|
| JP | 6893591 B1 | 6/2021 |
| JP | 2021-150426 A | 9/2021 |
| KR | 10-2010-0035194 A | 4/2010 |
| WO | 2021/125240 A1 | 6/2021 |
| WO | 2021/131171 A1 | 7/2021 |

* cited by examiner

LASER MODULE

CROSS-REFERENCE TO RELATED APPLICATION

This application claims the benefit of priority from Japanese Patent Application No. 2022-018680, filed on Feb. 9, 2022, the entire contents of which are incorporated herein by reference.

TECHNICAL FIELD

The present disclosure relates to a laser module.

BACKGROUND

Conventionally, a difference frequency generation type terahertz quantum cascade laser (DFG-THz-QCL: Difference Frequency Generation THz-Quantum Cascade Laser) is known (see, for example, Patent Document 1 (Japanese Patent No. 6893591) and Patent Document 2 (U.S. Patent Application Publication No. 2015/0311665)).

SUMMARY

In the terahertz quantum cascade laser as described above, from the viewpoint of user convenience, there is a demand for a product that can be miniaturized and packaged in a mode capable of suppressing loss of light contributing to generation of terahertz waves. However, Patent Documents 1 and 2 do not disclose a method for realizing such packaging.

Accordingly, an object of one aspect of the present disclosure is to provide a laser module that is packaged in such a manner that a size of the laser module can be reduced and loss of light contributing to generation of terahertz waves can be suppressed.

A laser module according to an aspect of the present disclosure includes a quantum cascade laser. The quantum cascade laser includes: a substrate having a main surface and a back surface opposite to the main surface; a first clad layer provided on the main surface; an active layer provided on an opposite side of the first clad layer to the substrate; and a second clad layer provided on an opposite side of the active layer to the first clad layer. The active layer has a first end surface and a second end surface facing each other in a second direction orthogonal to a first direction that corresponds to a stacking direction of the substrate, the first clad layer, the active layer, and the second clad layer. The first end surface constitutes a resonator for oscillating light of a first frequency and light of a second frequency. The active layer generates a terahertz wave having a difference frequency between the first frequency and the second frequency. The laser module further includes: a diffraction grating unit that includes a movable diffraction grating constituting an external resonator for the light of the first frequency; a first lens disposed between the quantum cascade laser element and the movable diffraction grating and configured to transmit light emitted from the second end surface and light returning from the movable diffraction grating to the quantum cascade laser element; and a second lens disposed at a position facing the first end surface and configured to transmit the terahertz wave emitted from the quantum cascade laser element; a first holder configured to hold the quantum cascade laser element; and a package that accommodates the quantum cascade laser element, the diffraction grating unit, the first lens, and the first holder and in which an optical path between a light incident surface of the second lens and the movable diffraction grating is disposed. The first holder includes: a support surface on which the quantum cascade laser element is mounted; a first side surface connected to the support surface and facing the first lens in the second direction. When viewed from a direction orthogonal to the first direction and the second direction, a first distance from an intersection point between the first side surface and the support surface to the second end surface along the second direction when a direction from the first lens toward the quantum cascade laser element along the second direction is a positive direction is smaller than a second distance between the intersection point and the first lens along the second direction.

In the laser module, a quantum cascade laser element, a first holder holding the quantum cascade laser element, a movable diffraction grating (diffraction grating unit), and a first lens disposed between the quantum cascade laser element and the movable diffraction grating are packaged to oscillate first frequency light and second frequency light necessary to generate a terahertz wave by generating a difference frequency. When the direction from the first lens to the quantum cascade laser element along the second direction (i.e., resonance direction) in which both end surfaces (first end surface and second end surface) of the quantum cascade laser element face each other is defined as a positive direction, the first distance from the intersection point between the first side surface of the first holder and the support surface along the second direction to the second end surface is smaller than the second distance between the intersection point and the first lens along the second direction. By arranging the quantum cascade laser element and the first holder in this manner, the quantum cascade laser element (second end surface) can be brought as close as possible to the first lens. Accordingly, it is possible to suppress an increase in size of the first lens and the movable diffraction grating and to reduce the size of the entire package. In addition, by setting the first distance to be small as described above, it is possible to suppress interference between the light emitted from the second end surface and the first holder (that is, a part of the emitted light is blocked by the first holder and does not reach the first lens). As a result, the loss of light contributing to the generation of terahertz waves can be reduced. As described above, it is possible to obtain a laser module which is packaged in such a manner that miniaturization is achieved and loss of light contributing to generation of terahertz waves can be suppressed.

The first distance may be less than or equal to 0. According to the above-described configuration, that is, the configuration in which the second end surface is flush with the first side surface or the configuration in which the second end surface protrudes from the first side surface toward the first lens side, it is possible to more reliably prevent interference between light emitted from the second end surface and the first holder, and thus it is possible to more effectively reduce loss of light contributing to generation of terahertz waves.

The first distance may be 0. According to the above-described configuration, that is, the configuration in which the second end surface is flush with the first side surface, since the entire portion extending to the second end surface of the quantum cascade laser element can be brought into contact with the first holder (support surface), heat dissipation efficiency from the quantum cascade laser element to the first holder can be improved.

A resonance axis passing through the first end surface and the second end surface in the quantum cascade laser element may intersect an optical axis of the second lens by the support surface being inclined such that the support surface intersects the optical axis of the second lens, and the first end surface may be spaced apart from the light incident surface of the second lens. According to the above configuration, it is possible to bring a quantum cascade laser element (for example, a side surface of a substrate continuous with a first end surface) into contact with or close to a light incident surface of a second lens while separating the first end surface constituting a resonator of first frequency light and second frequency light for generating a terahertz wave from the light incident surface of the second lens. Accordingly, it is possible to secure extraction efficiency of the terahertz wave from the quantum cascade laser element to the second lens while preventing the reflectance of the first end surface, which is important in oscillation of first frequency light and the second frequency light, from being affected by the second lens.

The first lens and the diffraction grating unit may be fixed to the first holder. According to the above-described configuration, before the quantum cascade laser element, the first lens, and the diffraction grating unit are housed in a package, these members can be fixed to the first holder and the positions of the members can be adjusted. Thus, the working efficiency can be improved as compared with the case where the position adjustment of each member is performed in the package.

The second lens may be a hemispherical or super-hemispherical silicon lens. The silicon lens is not easily scratched. In addition, even if damage or contamination occurs in the silicon lens, terahertz waves having a longer wavelength than visible light, near-infrared light, or the like are less likely to be affected by the damage or contamination, and thus the second lens can be disposed so as to be exposed to the outside of the package.

The first holder may have a second side surface connected to the support surface and facing the second lens in the second direction, and the first end surface may be located closer to the second lens than the second side surface in the second direction. According to the above configuration, the first end surface of the quantum cascade laser element protrudes toward the second lens from the second side surface of the first holder, and thus it is possible to bring the first end surface of the quantum cascade laser element into contact with or close to the second lens for outputting a terahertz wave while suppressing interference between the first holder and the second lens.

The package may have a side wall facing the first end surface, the side wall may have a through hole penetrating in a third direction perpendicular to the side wall, the through hole may include: a first hole portion that opens to an inside of the package; a second hole portion that opens to an outside of the package, and that includes the first hole portion and is larger than the first hole portion when viewed from the third direction; and an annular counterbore surface connecting the first hole portion and the second hole portion and extending along a plane intersecting the third direction. An outer edge portion of the light incident surface of the second lens may be inserted into the second hole portion from the outside of the package and may be fixed in surface contact with the counterbore surface. According to the above configuration, since the second lens for outputting a terahertz wave can be attached to the side wall from the outside of the package, the attachment work for the second lens can be easily performed. Further, the second lens can be used as a window material for closing a through hole provided in the side wall. As a result, the manufacturing cost can be reduced by reducing the number of components, and the entire package can be miniaturized. Further, since it is possible to avoid optical loss (attenuation of the terahertz wave which is output light) caused by providing a window material different from the second lens, it is also possible to realize high output of the terahertz wave.

The first end surface may be located inside the first hole portion. According to the above configuration, the first end surface of the quantum cascade laser element is extended to the inside of the first hole portion, and the substrate of the quantum cascade laser element may be brought into contact with or close to the light incident surface of the second lens. As a result, the extraction efficiency of terahertz waves can be improved, and the entire package can be reduced in size.

The first holder may include: a main body portion that includes a portion located closer to the first lens in the support surface and the first side surface; and a protruding portion connected to the main body portion and including a portion located closer to the second lens in the support surface, and at least a portion of the protruding portion may be located inside the first hole portion. According to the above configuration, the contact area between the quantum cascade laser element and the first holder (support surface) can be increased by extending the first holder (protruding portion) to the inside of the first hole portion. As a result, the heat dissipation efficiency from the quantum cascade laser element to the first holder can be increased.

The laser module may further include a second holder configured to hold the second lens. The second lens and the second holder may be accommodated in a package. The package may have a side wall facing the first end surface. The side wall may be provided with a light exit window for transmitting light that is emitted from the first end surface and passes through the second lens. According to the above configuration, since the second lens for outputting a terahertz wave can be accommodated in the package in the same manner as the first lens, damage and contamination of the second lens can be prevented.

The second holder may be fixed to the package independently of the first holder. According to the above configuration, since the first holder and the second holder are independent from each other, it is possible to perform an operation of attaching the quantum cascade laser element to the first holder and an operation of attaching the second lens to the second holder in parallel before each member is accommodated in the package. As a result, it is possible to improve the working efficiency of assembling the laser module.

The first lens and the diffraction grating unit may be fixed to the first holder, and the second holder may be integrally formed with the first holder or fixed to the first holder. According to the above configuration, since a structure in which the first holder and the second holder are integrated can be prepared outside the package, it is possible to perform position adjustment of the quantum cascade laser element, the first lens, the diffraction grating unit, and the second lens outside the package. Thus, the work efficiency can be improved as compared with the case where the position adjustment is performed in the package.

The second holder may have a through hole penetrating in a third direction perpendicular to the side wall. The through hole may include: a first hole portion that opens toward the quantum cascade laser element; and a second hole portion that opens toward the side wall, and that includes the first hole portion and is larger than the first hole portion when viewed from the third direction; and an annular counterbore surface connecting the first hole portion and the second hole portion and extending along a plane intersecting the second direction. An outer edge portion of the light incident surface of the second lens may be inserted into the second hole portion from a side wall side and may be fixed in surface contact with the counterbore surface. According to the above configuration, since the second lens for outputting a terahertz wave can be attached to the second holder from the outside of the second holder (the side of the second holder opposite to the side on which the quantum cascade laser element is disposed), the attachment work for the second lens can be easily performed.

The first end surface may be located inside the first hole portion. According to the above configuration, the first end surface of the quantum cascade laser element is extended to the inside of the first hole portion, and the substrate of the quantum cascade laser element may be brought into contact with or close to the light incident surface of the second lens. As a result, the extraction efficiency of terahertz waves can be improved, and the entire package can be reduced in size.

The first holder may have a main body portion that includes a portion located closer to the first lens in the support surface and the first side surface; and a protruding portion connected to the main body portion and including a portion located closer to the second lens in the support surface. At least a portion of the protruding portion may be located inside the first hole portion. According to the above configuration, the contact area between the quantum cascade laser element and the first holder (support surface) can be increased by extending the first holder (protruding portion) to the inside of the first hole portion. As a result, the heat dissipation efficiency from the quantum cascade laser element to the first holder can be increased.

A width of the protruding portion in a fourth direction orthogonal to the first direction and the second direction may be smaller than a width of the main body portion in the third direction. According to the above configuration, by making the width of the protruding portion smaller than the width of the main body portion, it is possible to secure the volume of the first holder that functions as a heat bath while preventing interference between the first holder and the package or the second holder.

The protruding portion may be formed in a shape in which the width of the protruding portion gradually decreases toward the second lens along the second direction. According to the above configuration, when the first holder on which the quantum cascade laser is mounted is housed and positioned in the package, the risk of interference (contact) between the protruding portion and the side wall (mainly the inner surface of the first hole portion) can be effectively reduced, and the volume of the first holder functioning as a heat bath can be sufficiently increased.

According to an aspect of the present disclosure, it is possible to provide a laser module that is packaged in such a manner that a size of the laser module can be reduced and loss of light contributing to generation of terahertz waves can be suppressed.

DETAILED DESCRIPTION

Figure 1:
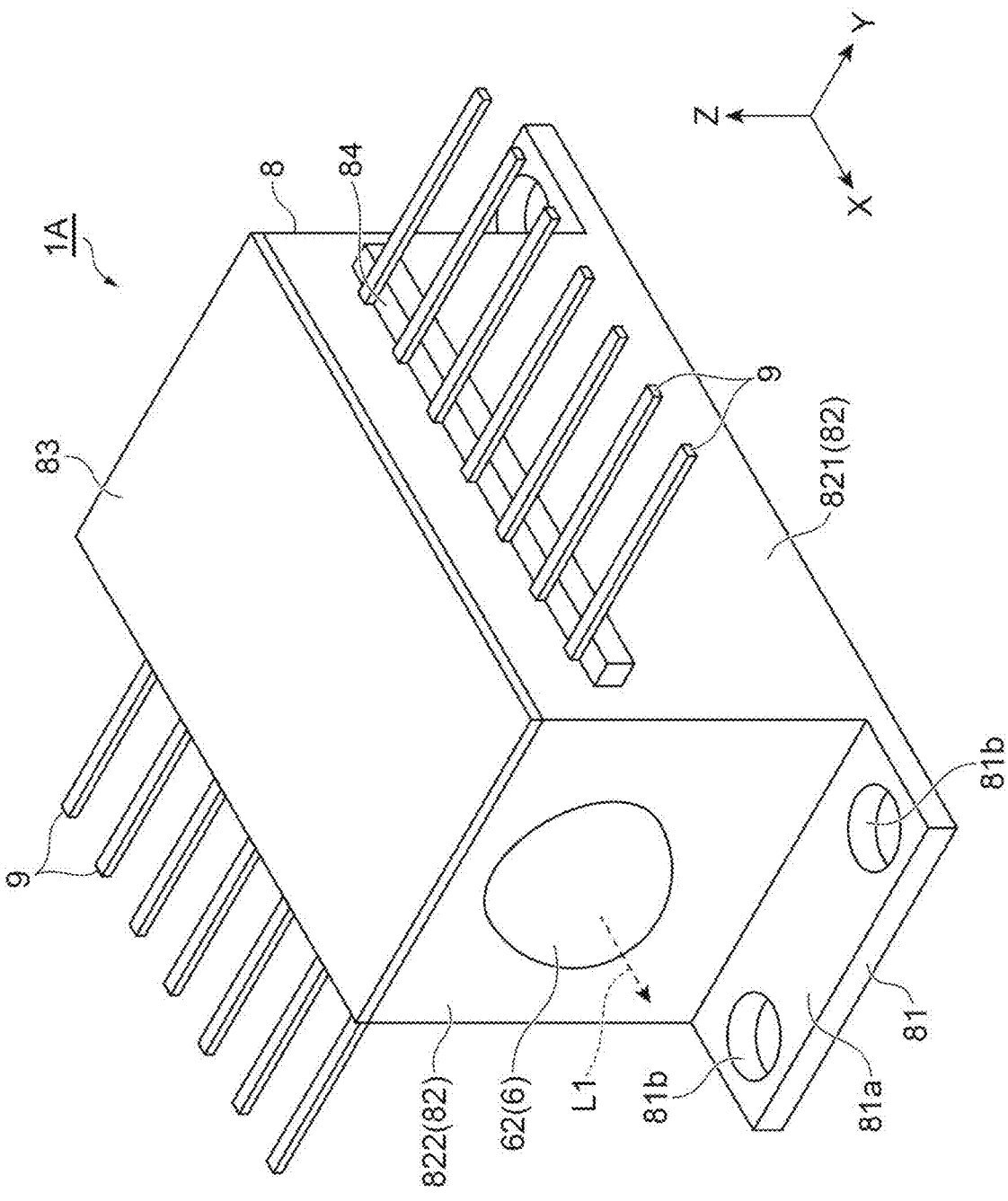
FIG. 1 is a perspective view of a laser module of a first embodiment.

Hereinafter, an embodiment of the present invention will be described in detail with reference to the drawings. In the following description, the same or corresponding elements are denoted by the same reference numerals, and redundant description will be omitted. Further, terms such as "upper" and "lower" are used for convenience based on the state shown in the drawings.

First Embodiment

A laser module 1A according to the first embodiment will be described with reference to FIGS. 1 to 7. The laser module 1A is a small-sized terahertz light source module having a size equal to or smaller than a hand-top size. As an example, the laser module 1A is configured to be a wavelength-variable light source and can operate in a single mode at room temperature by using a quantum cascade laser element 2 (hereinafter referred to as "QCL element 2") which is a difference frequency generation type terahertz quantum cascade laser (DFG-THz-QCL). The laser module 1A includes a QCL element 2, a diffraction grating unit 3, a first lens 4 (lens for external resonator), a lens holder 5, a second lens 6 (lens for terahertz wave output), a first holder 7, and a package 8.

The package 8 is a housing that airtightly accommodates the QCL element 2, the diffraction grating unit 3, the first lens 4, the lens holder 5, and the first holder 7. In the package 8, an optical path between the light incident surface 61 of the second lens 6 and the movable diffraction grating 31 (diffraction grating unit 3) is disposed. Note that members other than those described above (for example, a temperature sensor for measuring the temperature inside the package 8, a temperature control element such as a Peltier element, or the like) may be disposed inside the package 8.

Figure 2:
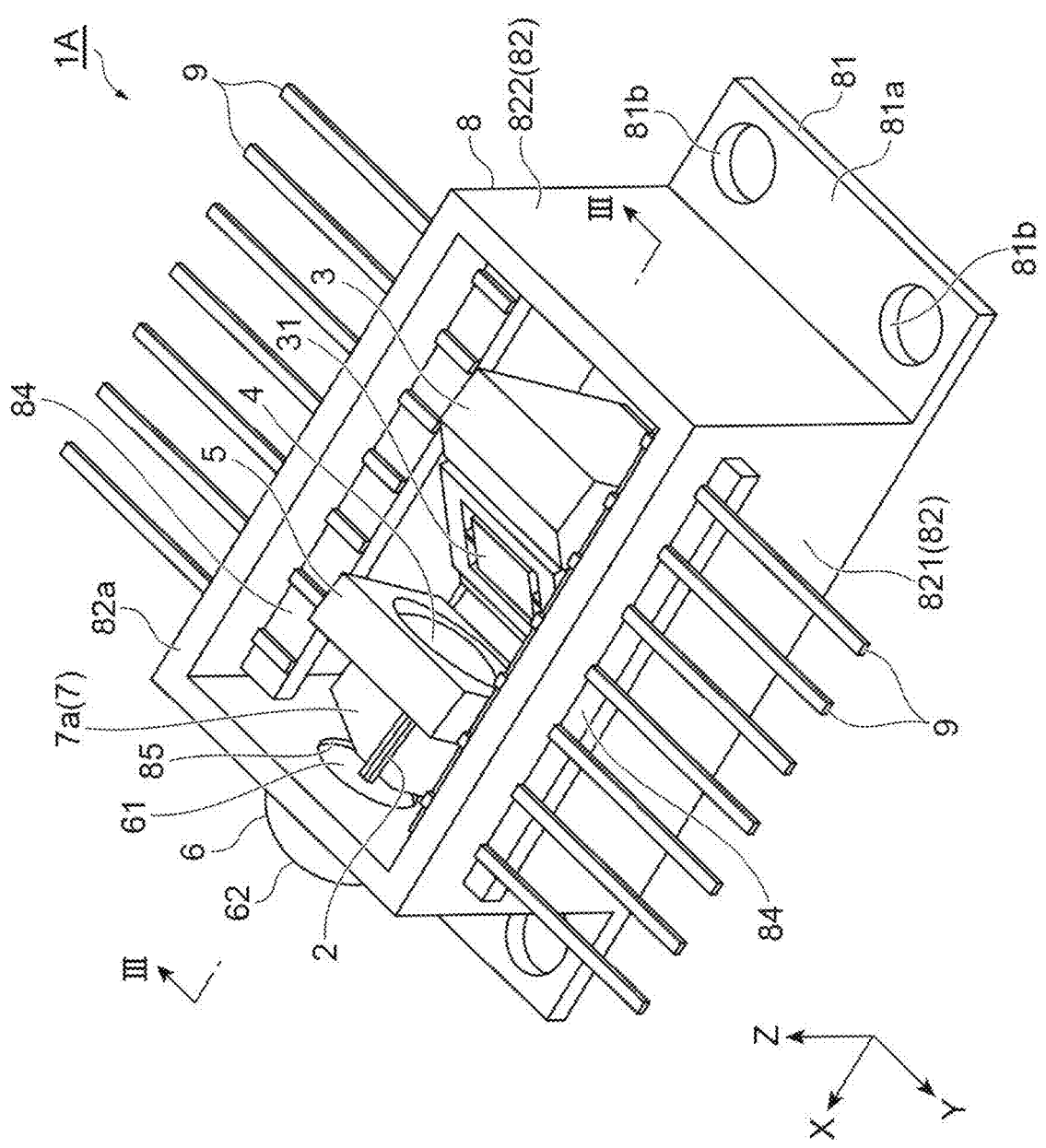
FIG. 2 is a perspective view of the laser module viewed from an angle different from that in FIG. 1.

In the present embodiment, as an example, the package 8 is a butterfly package. The package 8 includes a bottom wall 81, a side wall 82, and a top wall 83. In FIG. 2, the top wall 83 is not shown.

The bottom wall 81 is a rectangular plate-shaped member. The bottom wall 81 is formed of a metal material such as copper tungsten, for example. The bottom wall 81 is a base member on which the first holder 7 is mounted. In the present embodiment, the first holder 7 is placed directly on the bottom wall 81, but another member such as a heat dissipation member (for example, a Peltier element) may be disposed between the bottom wall 81 and the first holder 7. That is, the first holder 7 may be disposed on the bottom wall 81 via other members. In this specification, for the sake of convenience, a longitudinal direction of the bottom wall 81 is represented as an X-axis direction, a lateral direction of the bottom wall 81 is represented as a Y-axis direction, and a direction perpendicular to the bottom wall 81 (that is, a direction orthogonal to the X-axis direction and the Y-axis direction) is represented as a Z-axis direction.

The side wall 82 is erected on the bottom wall 81. The side wall 82 is formed in an annular shape so as to surround the internal space in which the QCL element 2 and the like are accommodated when viewed from the Z-axis direction. In the present embodiment, the side wall 82 is formed in a rectangular tubular shape. The side wall 82 is formed of a metal material such as Kovar. The side wall 82 is, for example, a Kovar frame plated with Ni/Au. In the present embodiment, the side wall 82 is provided at a central portion in the longitudinal direction (X-axis direction) of the bottom wall 81. The width of the side wall 82 in the lateral direction (Y-axis direction) is equal to the width of the bottom wall 81 in the lateral direction, and the width of the side wall 82 in the longitudinal direction (X-axis direction) is shorter than the width of the bottom wall 81 in the longitudinal direction. That is, protruding portions 81a are formed on both sides of the bottom wall 81 in the longitudinal direction so as to protrude outward from the side wall 82. A screw hole 81b for attaching the package 8 (bottom wall 81) to another member is provided in portions corresponding to four corners of the bottom wall 81 in the protruding portion 81a.

The top wall 83 is a member that closes the opening of the side wall 82 on the side opposite to the bottom wall 81 side. The top wall 83 has a rectangular plate shape. The outer shape (width in the longitudinal direction and the lateral direction) of the top wall 83 viewed from the Z-axis direction substantially coincides with the outer shape of the side wall 82. The top wall 83 is formed of, for example, the same metal material (for example, Kovar or the like) as that of the side wall 82. The top wall 83 is airtightly joined to an end portion 82a of the side wall 82 on the side opposite to the bottom wall 81 side by, for example, seam welding or the like in a state where the inside of the package 8 is evacuated or nitrogen-replaced.

In a pair of side walls 821 extending along the longitudinal direction (X-axis direction) of the side walls 82 (i.e., portions intersecting the lateral direction (Y-axis direction)), a plurality of lead terminals 9 (in the present embodiment, seven lead terminals on each side of the lateral direction, i.e., 14 lead terminals in total) for supplying current to members such as the QCL element 2 housed in the package 8 are inserted. Each lead terminal 9 is a flat plate-shaped conductive member extending in the Y-axis direction.

In addition, each of the pair of side walls 821 is provided with a protruding wall 84 that protrudes from both the outer surface side (the surface on the outer side of the package 8) and the inner surface side (the surface on the inner side of the package 8) of the side wall 821. The protruding wall 84 is an eaves-like member provided so as to extend along the X-axis direction above (on the top wall 83 side of) the center position of the side wall 821 in the Z-axis direction. The lead terminals 9 are arranged on the upper surface of the protruding wall 84 at substantially equal intervals along the X-axis direction.

A portion of the lead terminal 9 located outside the package 8 is electrically connected to a driving power source of the QCL element 2, a driving power source of the movable diffraction grating 31 (a power source for causing current to flow through a coil 315 described later), and the like. On the other hand, a portion of the lead terminal 9 located inside the package 8 functions as an electrode terminal for supplying power to each member (for example, the QCL element 2, the movable diffraction grating 31, or the like) inside the package 8. That is, the electrode terminal and each member in the package 8 are electrically connected to each other via a conductive wire (not shown), so that electric power is supplied from an external power source to each member via the lead terminal 9 and the wire. In addition, when the temperature sensor, the temperature control element, and the like are disposed in the package 8, these members are also electrically connected to the electrode terminals.

A through hole 85 penetrating in a direction perpendicular to the side wall 822 (i.e., third direction) is provided in the side wall 822 facing one end surface 2a of the QCL element 2 among a pair of the side walls 822 (i.e., portions intersecting the longitudinal direction (X-axis direction)) extending along the lateral direction (Y-axis direction) of the side wall 82. The second lens 6 is attached to the through hole 85.

Next, the configuration of each unit housed in the package 8 will be described.

[Configuration of Quantum Cascade Laser Element]

The QCL element 2 is a terahertz light source configured to be capable of outputting a terahertz wave in a room temperature environment. A configuration example of the QCL element 2 will be described in detail mainly with reference to FIGS. 3 and 4. FIG. 4 shows a cross-sectional structure of the QCL element 2 taken along a plane passing through the central portion in the Y-axis direction and parallel to the Z-axis direction. The QCL element 2 has a rod shape. The QCL element 2 can be formed as a ridge-stripe laser element by a general semiconductor process. The QCL element 2 is, for example, obtained by forming InGaAs/InAlAs on an InP substrate (substrate 21 described later) by epitaxial growth.

The QCL element 2 has end surfaces 2a and 2b facing each other along the longitudinal direction, and emits broadband light in the mid-infrared region (for example, 3 μm or more and 20 μm or less) from each of the end surfaces 2a and 2b. The end surfaces 2a and 2b are cleavage surfaces formed by cleavage, for example. The end surface 2a is a surface facing the second lens 6. The end surface 2b is a surface facing the first lens 4. The end surface 2b may be provided with, for example, a low-reflection coating having a reflectivity of 5% or less with respect to wavelengths at which the gain of the QCL element 2 peaks. The QCL element 2 may have a structure in which a plurality of active layers having center wavelengths different from each other are stacked or may have a structure including a single active layer in order to emit broadband light as described above.

As illustrated in FIG. 4, the QCL element 2 includes a substrate 21 and a semiconductor layer 10. The semiconductor layer 10 includes a lower clad layer 11 (first clad layer), an active layer 12, and an upper clad layer 13 (second clad layer). In the present embodiment, the semiconductor layer 10 further includes an upper guide layer 14, a lower guide layer 15, an upper contact layer 16, and a lower contact layer 17.

The substrate 21 has a main surface 21a and a back surface 21b opposite to the main surface 21a. The main surface 21a is a surface on the side where the active layer 12 is disposed. The back surface 21b is a surface facing the support surface 7a (see FIGS. 2 and 3) of the first holder 7. The substrate 21 is, for example, a rectangular plate-shaped InP single-crystal substrate (semi-insulating substrate: high-resistance semiconductor substrate not doped with impurities). The length, width, and thickness of the substrate 21 are about several hundred μm to several mm, about several hundred μm to several mm, and about several hundred μm, respectively. The terahertz wave generated by the difference frequency generation inside the active layer 12 is extracted to the outside (second lens 6) mainly through the substrate 21. From the viewpoint of increasing the extraction efficiency of terahertz waves from the substrate 21 to the outside, the substrate 21 is preferably a semi-insulating substrate as described above or a substrate having a carrier density of $1 \times 10^{17}$ cm$^{-3}$ or less.

The substrate 21 has a side surface 21c that connects the main surface 21a and the back surface 21b. The side surface 21c faces the light incident surface 61 of the second lens 6. In order to avoid total internal reflection of the terahertz wave propagating inside the substrate 21 at the cleaved substrate end surface (side surface 21c) and increase extraction efficiency of the terahertz wave to the outside, the side surface 21c is polished so as to be inclined at an angle $\theta_1$ shown in FIG. 4. Further, in order to avoid deterioration of oscillation characteristics of mid-infrared light, the polished inclined surface is configured not to reach the epitaxial growth layer including the active layer 12 (i.e., the semiconductor layer 10). More particularly, the side surface 21c has a first surface 21d which is an inclined surface formed by polishing and a second surface 21e which is left unpolished.

The first surface 21d is connected to the back surface 21b, and extends from the back surface 21b toward the main surface 21a. The first surface 21d is inclined with respect to the main surface 21a and the back surface 21b. The first surface 21d is inclined such that the distance from the end surface 2b increases from the back surface 21b toward the main surface 21a. The angle $\theta$, formed by the first surface 21d and the main surface 21a is, for example, about 30° to 80°. The first surface 21d is, for example, a polished surface formed by polishing a rectangular plate-shaped semiconductor substrate. A corner portion 21f that connects the first surface 21d and the back surface 21b is formed between the first surface 21d and the back surface 21b.

The second surface 21e is connected to an end portion on the main surface 21a side of the first surface 21d and the main surface 21a. The second surface 21e is inclined with respect to the first surface 21d. The second surface 21e is substantially orthogonal to the main surface 21a and the back surface 21b. A corner portion 21g that connects the second surface 21e and the main surface 21a is formed between the second surface 21e and the main surface 21a. A corner portion 21h that connects the first surface 21d and the second surface 21e is formed between the first surface 21d and the second surface 21e. Since the first surface 21d is an inclined surface as described above, the corner portion 21f is located closer to the end surface 2b than the corner portion 21h.

The semiconductor layer 10 is provided on the main surface 21a of the substrate 21. The semiconductor layer 10 has a side surface 10a. The side surface 10a is a part of the end surface 2a of the QCL element 2. The side surface 10a is a flat surface. The side surface 10a is substantially orthogonal to the main surface 21a and the back surface 21b of the substrate 21. That is, in this embodiment, the side surface 10a is located on the same plane as the second surface 21e of the substrate 21. The thickness of the semiconductor layer 10 is about 10 μm to 20 μm.

The lower contact layer 17 is, for example, an InGaAs layer (Si-doped: $1.5 \times 10^{18}$/cm$^3$) having a thickness of approximately 400 nm, and is provided on the main surface 21a of the substrate 21. The lower clad layer 11 is, for example, an InP layer (Si-doped: $1.5 \times 10^{16}$/cm$^3$) having a thickness of approximately 5 μm, and is provided on a surface of the lower contact layer 17. That is, the lower clad layer 11 is provided on the main surface 21a of the substrate 21 via the lower contact layer 17. The lower guide layer 15 is, for example, an InGaAs layer (Si-doped: $1.5 \times 10^{16}$/cm$^3$) having a thickness of approximately 250 nm, and is provided on a surface of the lower clad layer 11.

The active layer 12 has a quantum cascade structure, and is provided on the surface of the lower guide layer 15. In other words, the active layer 12 is provided on the side opposite to the substrate 21 of the lower clad layer 11. The active layer 12 has an end surface 21a (first end surface) and an end surface 21b (second end surface) facing each other in a direction D2 (second direction) perpendicular to a direction D1 (first direction) which is a stacking direction of the substrate 21 and the semiconductor layer 10. The end surface 12a of the active layer 12 is a part of the end surface 2a of the QCL element 2 and the side surface 10a of the semiconductor layer 10. The end surface 12b of the active layer 12 is a part of the end surface 2b of the QCL element 2. As an example, the active layer 12 has a structure in which a plurality of InGaAs layers and InAlAs layers are alternately stacked along the direction D1.

The upper guide layer 14 is, for example, InGaAs layer (Si-doped: $1.5 \times 10^{16}$/cm$^3$) having a thickness of approximately 450 nm, and is provided on a surface of the active layer 12. The upper clad layer 13 is, for example, an InP layer (Si doped: $1.5 \times 10^{16}$/cm$^3$) having a thickness of approximately 5 μm, and is provided on a surface of the upper guide layer 14. That is, the upper clad layer 13 is provided on the opposite side of the active layer 12 from the lower clad layer 11. The upper contact layer 16 is, for example, an InP layer (Si doped: $1.5 \times 10^{18}$/cm$^3$) having a thickness of approximately 15 nm, and is provided on a surface of the upper clad layer 13.

In order to obtain a terahertz wave of a single mode, it is necessary to simultaneously oscillate single modes (both are mid-infrared light) of two different wavelengths inside the QCL element 2. In the present embodiment, a single mode of one wavelength (wavelength corresponding to the second frequency $\omega_2$) is oscillated by a diffraction grating (described in detail later) provided inside the QCL element 2, and a single mode of the other wavelength (wavelength corresponding to the first frequency $\omega_1$ different from the second frequency $\omega_2$) is oscillated by an external resonator (described in detail later). In order to oscillate the single mode of the one wavelength, a diffraction grating layer 14a functioning as a distributed feedback (DFB) structure is formed in the upper guide layer 14 along a direction D2 (that is, a resonance direction) in which an end surface 12a and an end surface 12b face each other. The diffraction grating layer 14a oscillates, in a single mode, light having wavelengths (wavelengths corresponding to the second frequency $\omega_2$) deviated from the wavelengths corresponding to the gain peak of the QCL element 2. The QCL element 2 is in a state in which a single mode by DFB and a Fabry-Perot mode simultaneously have gain. The light of the first frequency $\omega_1$ (hereinafter referred to as "first light") and the light of the second frequency $\omega_2$ (hereinafter referred to as "second light") are mid-infrared light.

The end surface 12a and the end surface 12b of the active layer 12 constitute a resonator that oscillates the second light. On the other hand, the end surface 12a of the active layer 12 and the movable diffraction grating 31 which is an external resonator constitute a resonator for oscillating the first light. As a result of oscillating the first light and the second light according to this configuration, the active layer 12 generates a terahertz wave having a difference frequency $\omega_3$ (=$\omega_1$−$\omega_2$) between the first frequency $\omega_1$ of the first light and the second frequency $\omega_2$ of the second light through difference frequency generation by Cherenkov phase matching.

The radiation direction A1 of the terahertz wave generated in this manner is inclined downward (toward the substrate 21) by a radiation angle $\theta_C$ (Cherenkov radiation angle) with respect to the direction (right direction in FIG. 4) from the end surface 12b toward the end surface 12a along the resonance direction (direction D2). More specifically, the terahertz wave generated by the active layer 12 propagates as a plane wave (i.e., at the same phase) in the substrate 21 at a radiation angle $\theta_C$ expressed by the following Expression (1). In the following Expression (1), $n_{MIR}$ is a refractive index of the substrate 21 with respect to the mid-infrared light, and $n_{THz}$ is a refractive index of the substrate 21 with respect to the terahertz wave.

$$\theta_C = \cos^{-1}(n_{MIR}/n_{THz}) \tag{1}$$

[Configuration of Terahertz Wave Output Lens (Second Lens)]

The second lens 6 is a lens for outputting the terahertz wave generated by the QCL element 2 to the outside. The second lens 6 transmits the output light (terahertz wave L1) from the QCL element 2. The second lens 6 is, for example, a hemispherical or super-hemispherical silicon lens. The silicon lens is not easily scratched. In addition, even if damage or contamination occurs, since terahertz waves having a longer wavelength than visible light, near-infrared light, and the like are less likely to be affected by the damage or contamination, the second lens 6 can be disposed so as to be exposed to the outside of the package 8.

In the present embodiment, the second lens 6 is a super-hemispherical lens. The second lens 6 has a flat light incident surface 61 facing the end surface 2a of the QCL element 2, and a curved light exit surface 62 that emits terahertz wave L1 as output light to the outside of the package 8. The lens diameter of the second lens 6 is not limited to a specific range. However, when the second lens 6 is a hemispherical or super-hemispherical lens, the lens diameter is directly reflected in the thickness of the lens. Therefore, from the viewpoint of realizing miniaturization of the laser module 1A, it is preferable that the lens diameter of the second lens 6 is equal to or smaller than the 20 mm. Further, the material of the second lens 6 is not limited to silicon. For example, the second lens 6 may be formed of another material that transmits terahertz waves, such as Tsurupica. Further, the light exit surface 62 of the second lens 6 may be provided with a low reflection coating for reducing the reflectance of the terahertz wave in order to increase the extraction efficiency of the terahertz wave.

The second lens 6 is attached to a through hole 85 provided in the side wall 822 of the package 8. Hereinafter, the attachment structure of the second lens 6 to the through hole 85 will be described in detail.

Figure 3:
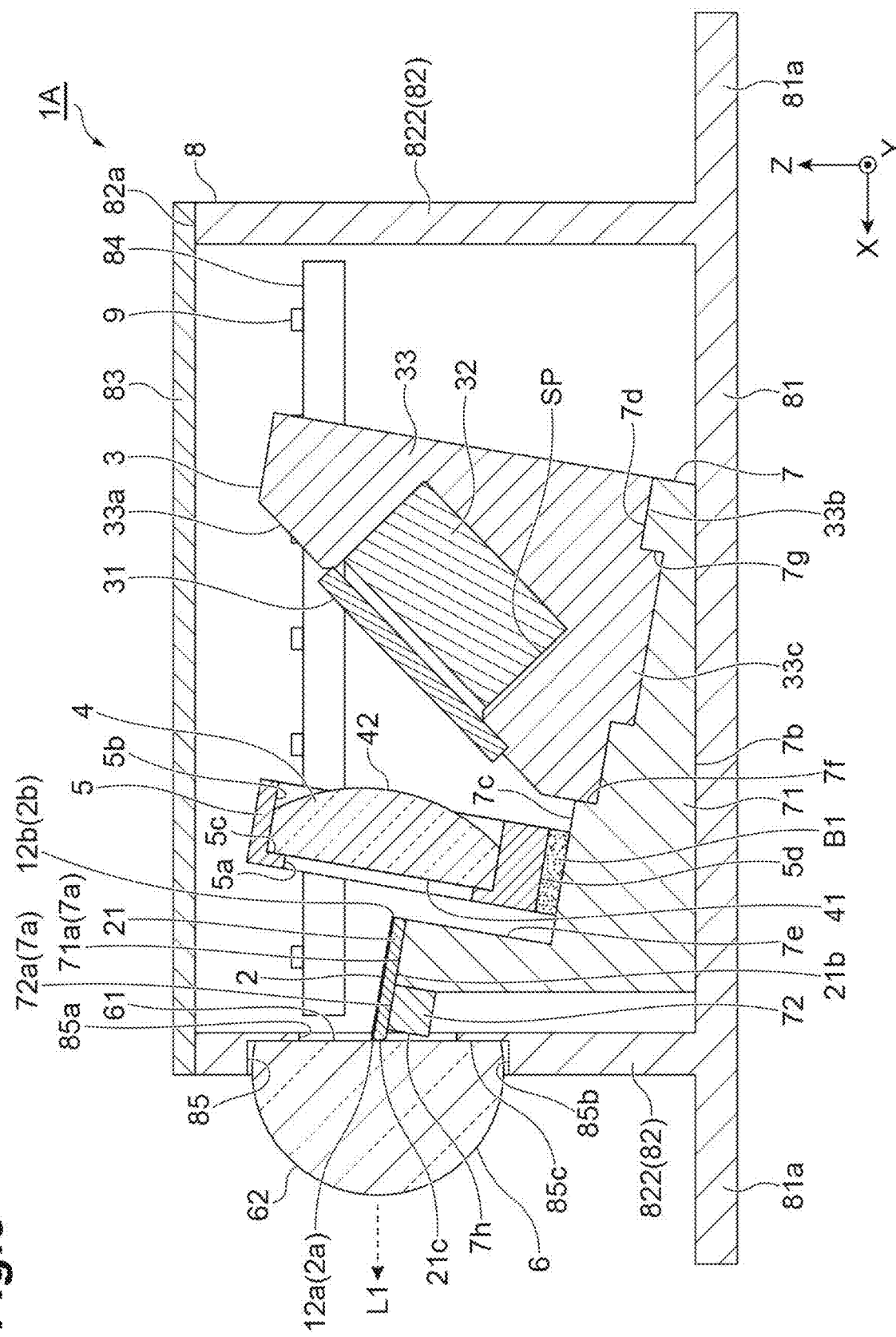
FIG. 3 is a cross-sectional view of the laser module taken along line III-III of FIG. 2.
Figure 4:
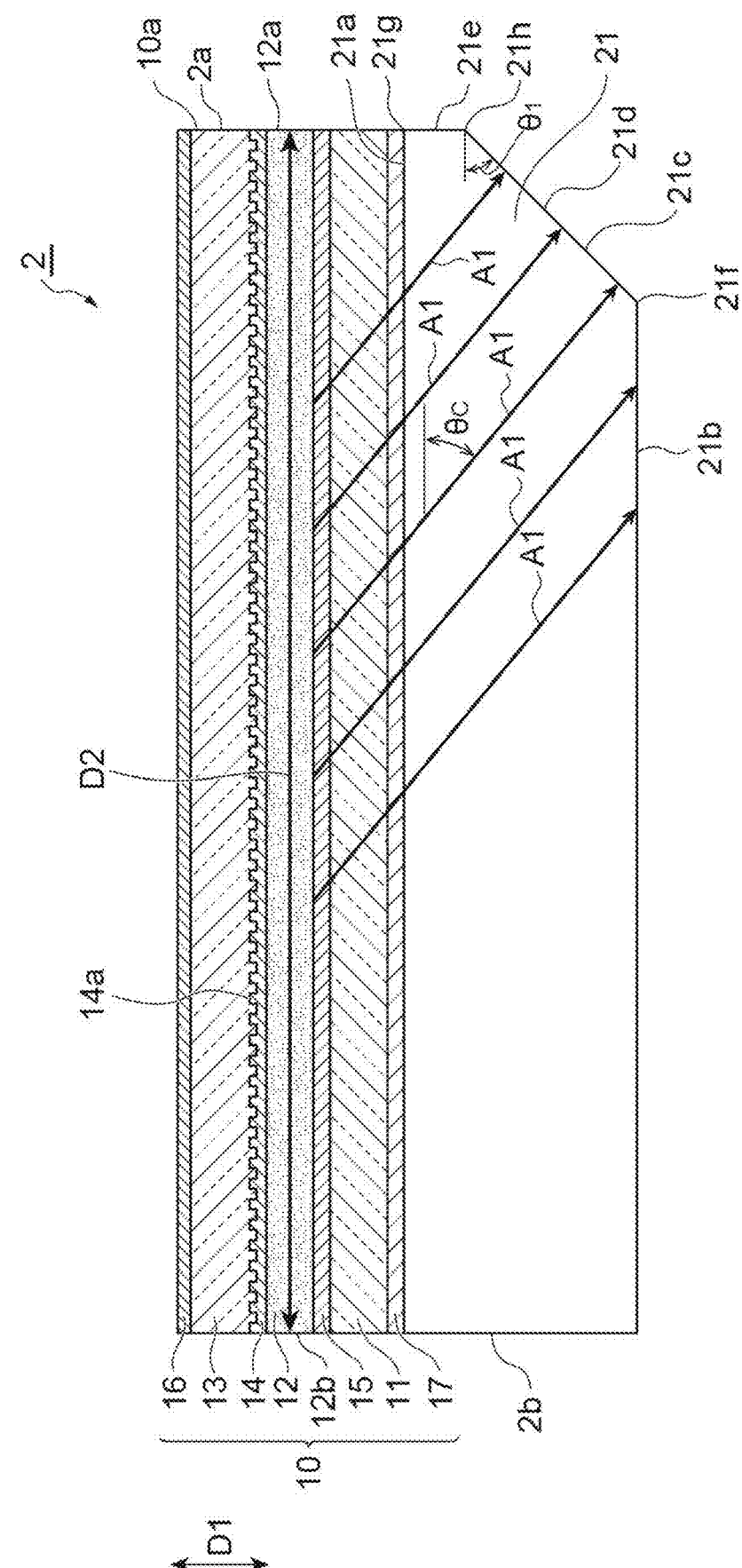
FIG. 4 is a cross-sectional view of a quantum cascade laser element.

As shown in FIG. 3, the through hole 85 has a small-diameter hole 85a (first hole portion), a large-diameter hole 85b (second hole portion), and a counterbore surface 85c. The small-diameter hole 85a opens to the inside the package 8 in the optical axis direction (i.e., the X-axis direction) of the second lens 6. The large-diameter hole 85b opens to the outside of the package 8 in the X-axis direction. The large-diameter hole 85b includes the small-diameter hole 85a and has a shape larger than the small-diameter hole 85a when viewed from the X-axis direction. The small-diameter hole 85a and the large-diameter hole 85b each extend in the X-axis direction. In the present embodiment, each of the small-diameter hole 85a and the large-diameter hole 85b is formed in a circular shape, and a diameter of the large-diameter hole 85b is larger than a diameter of the small-diameter hole 85a. As an example, the central axes of the small-diameter hole 85a and the large-diameter hole 85b substantially coincide with the optical axis AX2 of the second lens 6 (see FIG. 6).

The counterbore surface 85c is an annular surface that connects the small-diameter hole 85a and the large-diameter hole 85b and extends along a plane (YZ plane) intersecting the X-axis direction. More specifically, the counterbore surface 85c connects an end portion of the small-diameter hole 85a on a side facing the large-diameter hole 85b and an end portion of the large-diameter hole 85b on a side facing the small-diameter hole 85a. The large-diameter hole 85b and the counterbore surface 85c can be formed by counterboring the side wall 822 from the outside of the package 8. Although the counterbore surface 85c is formed in a continuous annular shape in the present embodiment, the counterbore surface 85c may be formed in a discontinuous annular shape. For example, a cutout may be formed in a portion of the inner surface of the small-diameter hole 85a, and the counterbore surface 85c may be divided at the portion where the cutout is formed. The through hole 85 penetrating in the X-axis direction is formed by the small-diameter hole 85a and the large-diameter hole 85b connected by the counterbore surface 85c.

An outer edge portion of the light incident surface 61 of the second lens 6 is inserted into the large-diameter hole 85b from the outside of the package 8 and fixed in surface contact with the counterbore surface 85c. The outer edge of the light incident surface 61 is secured to the counterbore surface 85c by, for example, a fixing plastic, an adhesive, or the like. The second lens 6 attached to the through hole 85 of the side wall 822 functions to receive the terahertz wave L1 output from the QCL element 2 on the light incident surface 61 and extract the terahertz wave L1 from the light exit surface 62 to the outside of the package 8 while collimating the terahertz wave into a beam shape. Further, the second lens 6 also has a function of keeping the inside of the package 8 airtight. According to the above configuration, since the second lens 6 for terahertz wave output can be attached to the side wall 822 from the outside of the package 8, the attachment work for the second lens 6 can be easily performed. In addition, the second lens 6 can be used as a window material that closes the through hole 85 provided in the package 8 (side wall 822). As a result, the manufacturing cost can be reduced by reducing the number of components, and the entire package can be miniaturized. Further, since it is possible to avoid light loss caused by providing a window material different from the second lens 6 (that is, attenuation of the terahertz wave L1 caused by passing through the window material different from the second lens 6), it is also possible to realize high output of the terahertz wave L1. According to the method of attaching the second lens 6, the hemispherical or super-hemispherical second lens 6 having no edge thickness for holding the lens from the side surface can be easily and accurately fixed.

[Positional Relationship Between QCL Element and Second Lens]

Figure 5:
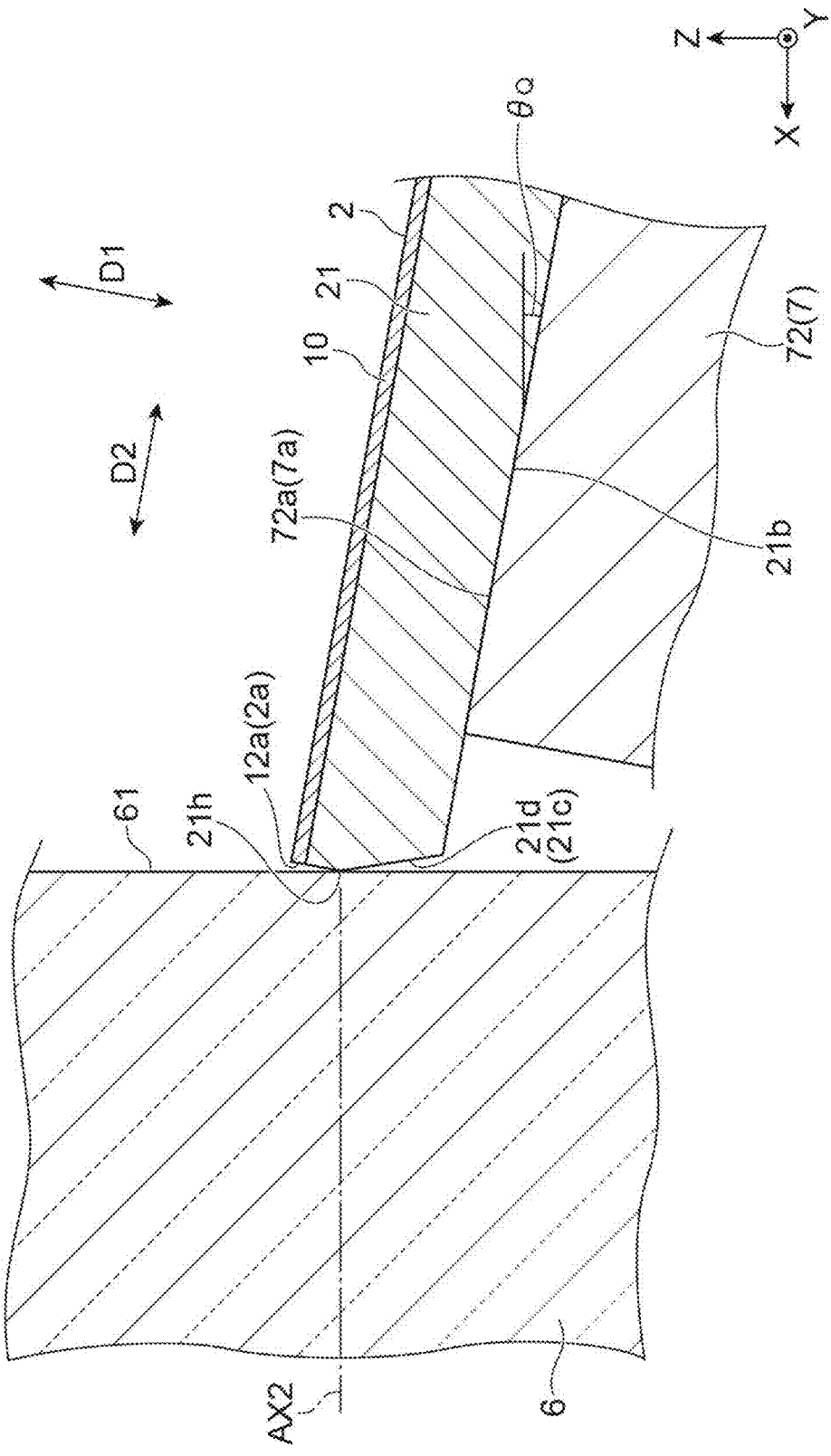
FIG. 5 is a diagram illustrating a positional relationship between a quantum cascade laser element and a second lens.

Next, the positional relationship between the QCL element 2 and the second lens 6 will be described. As illustrated in FIGS. 3 and 5, the QCL element 2 and the second lens 6 are disposed such that a portion of the side surface 21c of the substrate 21 of the QCL element 2 is in contact with a substantially central portion of the light incident surface 61 of the second lens 6. For this purpose, the QCL element 2 is disposed to be inclined with respect to an optical axis direction (X-axis direction) of the second lens 6. Accordingly, the QCL element 2 and the second lens 6 are disposed such that the end surface 12a of the active layer 12 and the light incident surface 61 are spaced apart from each other and only a portion of the side surface 21c of the substrate 21 is in contact with the light incident surface 61. As an example, as shown in FIG. 5, the corner portion 21h of the side surface 21c is brought into line contact with the light incident surface 61. Alternatively, the first surface 21d, which is an inclined surface among the side surfaces 21c, may be brought into surface contact with the light incident surface 61. By separating the end surface 12a of the active layer 12 from the light incident surface 61 in this manner, it is possible to prevent the oscillation characteristics of the mid-infrared light in the end surface 12a from being affected. Note that an inclination angle $\theta_Q$ (see FIG. 5) of the QCL element 2 with respect to the optical axis direction (X-axis direction) of the second lens 6 is set so as to substantially coincide with, for example, a radiation angle $\theta_C$ (see FIG. 4) of the terahertz wave L1 generated inside the QCL element 2. For example, the QCL element 2 may be tilted with respect to the second lens 6 so that the radiation direction A1 (see FIG. 4) of the terahertz wave L1 generated inside the QCL element 2 substantially coincides with the optical axis direction (X-axis direction) of the second lens 6.

The resonance axis (i.e., axis along the resonance direction (direction D2)) passing through the end surface 12a and the end surface 12b of the QCL element 2 intersects the optical axis AX2 of the second lens 6 because the support surface 7a is inclined so as to intersect the optical axis AX2 of the second lens 6 (i.e., because the QCL element 2 is mounted on the support surface 7a formed in an inclined surface). The end surface 12a is spaced apart from the light incident surface 61 of the second lens 6, and the first lens 4 is disposed such that the optical axis AX1 of the first lens 4 substantially coincides with the resonance axes. According to the above configuration, it is possible to bring the QCL element 2 (for example, the side surface 21c of the substrate 21 continuous with the end surface 12a) into contact with or close to the light incident surface 61 of the second lens 6 while separating the end surface 12a constituting the resonators of the first light and the second light for generating the terahertz wave L1 from the light incident surface 61 of the second lens 6. Thus, the extraction efficiency of the terahertz wave L1 from the QCL element 2 to the second lens 6 can be secured while preventing the reflectivity of the end surface 12a, which is important in the oscillation of the first light and the second light, from being affected by the second lens 6 (that is, preventing the reflection characteristic of the end surface 12a from changing due to the end surface 12a coining into contact with the light incident surface 61 of the second lens 6).

From the viewpoint of efficiently introducing the terahertz wave L1 into the second lens 6, the focal point of the second lens 6 is preferably located inside the QCL element 2. By partially bringing the second lens 6 and the QCL element 2 (substrate 21) into contact with each other in this manner, the influence of the refractive index of air interposed therebetween (that is, light loss due to reflection at the interface with air) is reduced. As a result, the terahertz wave L1 emitted from the QCL element 2 can be efficiently introduced into the second lens 6, and the output of the terahertz wave L1 can be increased. In addition, it is possible to suppress the spread of the terahertz wave L1 radiated by the second lens 6 and obtain an output of an appropriate beam shape.

[Configuration of External Resonator]

The first lens 4 and the movable diffraction grating 31 (diffraction grating unit) constitute an external resonator that oscillates the above-described first light (light of the first frequency $\omega_1$). That is, the first light reciprocates between the end surface 12a of the active layer 12 and the movable diffraction grating 31 (to be specific, a diffraction grating portion 314 to be described later) via the first lens 4, whereby the first light is amplified. From the viewpoint of reducing the size of the laser module 1A and the loss of light, it is preferable that the first lens 4 and the movable diffraction grating 31 be disposed as close as possible to each other within a range in which interference between members in the package 8 does not occur.

(Configuration of Lens for External Resonator (First Lens))

The first lens 4 is a lens for an external resonator and transmits mid-infrared light. The first lens 4 may be formed of, for example, zinc selenide (ZnSe). The first lens 4 is, for example, an aspherical lens whose working distance is equal to or less than 3 mm From the viewpoint of increasing the efficiency as an external resonator, the first lens 4 is preferably configured to have a working distance of 1 mm or less and a numerical aperture of 0.6 or more. The first lens 4 is disposed between the QCL element 2 and the movable diffraction grating 31, and transmits light emitted from the end surface 12b (mid-infrared light) and light returning from the movable diffraction grating 31 to the QCL element 2 (mid-infrared light).

The first lens 4 has a first lens surface 41 and a second lens surface 42. The first lens 4 is, for example, an aspherical lens. The first lens surface 41 is a surface facing an end surface 2b of the QCL element 2 (an end surface 12b of the active layer 12). The first lens surface 41 may be a flat surface or a non-flat surface (for example, a curved surface that protrudes toward the QCL element 2). The second lens surface 42 is a curved surface facing the movable diffraction grating 31 on a side opposite to the first lens surface 41. The first lens surface 41 and the second lens surface 42 may be provided with, for example, a low reflection coating having a reflectance of 5% or less with respect to a wavelength corresponding to a gain peak of the QCL element 2. As the material of the first lens 4, a material that transmits mid-infrared light such as Ge or $CaF_2$ may be used.

The first lens 4 is fixed to the lens holder 5 so that the optical axis AX1 of the first lens 4 (see FIG. 6) and the resonance axes of the QCL element 2 (i.e., the axis parallel to the direction D2 passing through the end surface 12a and the end surface 12b of the active layer 12 and the optical axis of the mid-infrared light emitted by the QCL element 2) substantially coincide with each other. That is, the first lens 4 and the movable diffraction grating 31 are arranged so as to be inclined with respect to the horizontal plane (XY plane) in the same manner as the QCL element 2. That is, the radiation direction A1 of the terahertz wave L1 and the resonance direction (direction D2) of the external resonator are not on the same straight line but intersect each other.

The first lens 4 is held by the lens holder 5. As an example, the lens holder 5 has a substantially rectangular parallelepiped outer shape. The lens holder 5 has a small-diameter hole 5a, a large-diameter hole 5b, and a counterbore surface 5c. The small-diameter hole 5a opens to the QCL element 2 side in the optical axis direction (direction D2) of the first lens 4. The large-diameter hole 5b opens to the movable diffraction grating 31 side in the direction D2. The large-diameter hole 5b includes the small-diameter hole 5a and has a shape larger than the small-diameter hole 5a when viewed from the direction D2. The small-diameter hole 5a and the large-diameter hole 5b each extend in the direction D2. Each of the small-diameter hole 5a and the large-diameter hole 5b is formed in a circular shape, and a diameter of the large-diameter hole 5b is larger than that of the small-diameter hole 5a. As an example, the central axes of the small-diameter hole 5a and the large-diameter hole 5b substantially coincide with the optical axis AX1 of the first lens 4. The counterbore surface 5c is an annular surface connecting the small-diameter hole 5a and the large-diameter hole 5b and extending along a plane intersecting the direction D2. More specifically, the counterbore surface 5c connects an end portion of the small-diameter hole 5a on a side facing the large-diameter hole 5b and an end portion of the large-diameter hole 5b on a side facing the small-diameter hole 5a. An outer edge portion of the first lens surface 41 of the first lens 4 is inserted into the large-diameter hole 5b and fixed in surface contact with the counterbore surface 5c. The outer edge portion of the first lens surface 41 is fixed to the counterbore surface 5c by, for example, a fixing plastic, an adhesive, or the like.

(Configuration of Diffraction Grating Unit)

The diffraction grating unit 3 is disposed on the side opposite to the side on which the QCL element 2 is disposed with respect to the first lens 4 (lens holder 5). The diffraction grating unit 3 includes a movable diffraction grating 31, a magnet 32, and a yoke 33. The movable diffraction grating 31 is formed in a substantially plate shape. The movable diffraction grating 31 is a MEMS diffraction grating manufactured using, for example, a MEMS process. The movable diffraction grating 31 is not limited to a specific configuration. For example, the movable diffraction grating 31 may be an electrostatic drive type in which the diffraction grating angle can be fixed at an arbitrary angle, or may be an electromagnetic drive type in which high-frequency angle modulation at a resonance frequency can be performed. The magnet 32 is disposed on a side opposite to the QCL element 2 with respect to the movable diffraction grating 31. The movable diffraction grating 31 is fixed to the yoke 33, and the magnet 32 is housed in the yoke 33. As described above, the movable diffraction grating 31, the magnet 32, and the yoke 33 are integrated to form one unit.

The light collimated by the first lens 4 enters the movable diffraction grating 31. By diffracting and reflecting this incident light, the movable diffraction grating 31 returns light of specific wavelengths of the incident light to the end surface 2b of the QCL element 2 (end surface 12b of the active layer 12) via the first lens 4. In this embodiment, the movable diffraction grating 31 and the end surface 2b constitute a Littrow type external resonator.

Further, in the movable diffraction grating 31, the direction of the diffraction grating portion 314 (see FIG. 7) that diffracts and reflects incident light can be changed at high speed. As a result, the wavelengths of light returning from the movable diffraction grating 31 to the end surface 12b of the QCL element 2 (i.e., wavelengths corresponding to the first frequency $\omega_1$) are variable. That is, it is possible to change the wave length of the terahertz wave L1 generated by generating the difference frequency between the first frequency $\omega_1$ and the second frequency $\omega_2$. Thus, wavelength sweeping can be performed within the range of the gain band of the QCL element 2.

Figure 7:
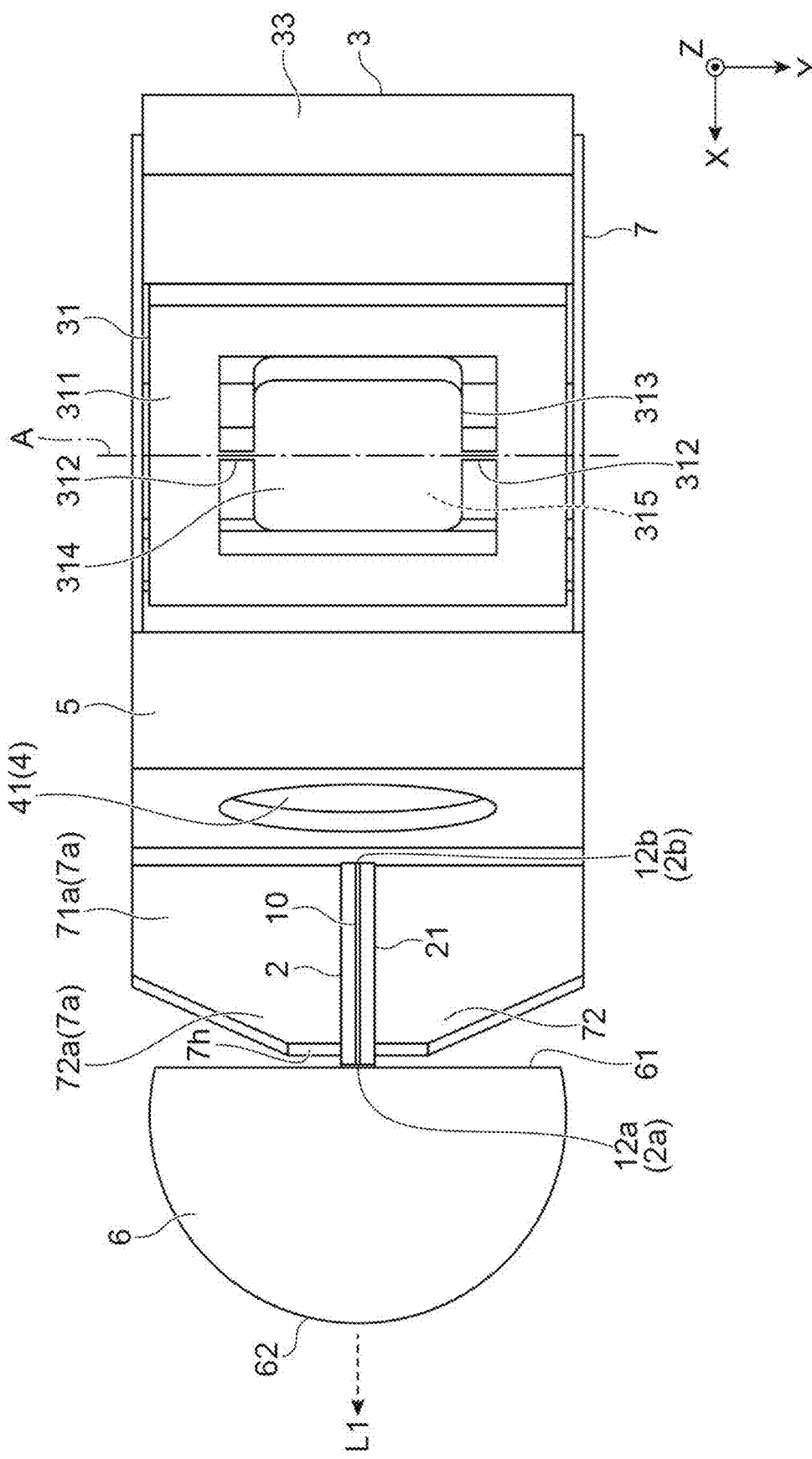
FIG. 7 is a plan view illustrating an arrangement configuration of a first lens, a lens holder, a second lens, a quantum cascade laser element, a first holder, and a diffraction grating unit accommodated in a package.

As shown in FIG. 7, the movable diffraction grating 31 includes a support portion 311, a pair of connection parts 312, a movable portion 313, a diffraction grating portion 314, and a coil 315. The movable diffraction grating 31 is configured as a MEMS device that causes the movable portion 313 to swing about an axis A passing through the pair of connection parts 312. The axis A is an axis parallel to the Y-axis direction.

The support portion 311 is a flat plate-shaped frame body having a rectangular shape in a plan view. The support portion 311 supports the movable portion 313 via a pair of connection parts 312. Each connection part 312 is a flat plate-like member having a rectangular bar shape in a plan view, and extends straight along the axis A. Each connection part 312 connects the movable portion 313 to the support portion 311 on the axis A such that the movable portion 313 is swingable about the axis A.

The movable portion 313 is located inside the support portion 311. The movable portion 313 is swingable about the axis A as described above. The movable portion 313 is a flat plate-shaped member having a substantially rectangular shape in plan view. The support portion 311, the connection part 312, and the movable portion 313 are integrally formed by being built in one SOI (Silicon on Insulator) substrate, for example.

The diffraction grating portion 314 is provided on a surface (mirror surface) of the movable portion 313 on the QCL element 2 side. The diffraction grating portion 314 has a plurality of grating grooves (not shown) and diffracts and reflects the light emitted from the QCL element 2. The diffraction grating unit 3 is disposed such that the optical axis AX1 of the first lens 4 (i.e., the optical axis of the mid-infrared light collimated by the first lens 4) substantially coincides with the center of the diffraction grating portion 314, and light incident on the diffraction grating portion 314 is diffracted in a direction opposite to the incident direction on the same optical axis AX1.

The diffraction grating portion 314 includes, for example, a resin layer which is provided on the surface of the movable portion 313 and formed with a diffraction grating pattern, and a metal layer provided over the surface of the resin layer along the diffraction grating pattern. Alternatively, the diffraction grating portion 314 may be formed of only a metal layer provided on the movable portion 313 and having a diffraction grating pattern formed thereon. As the diffraction grating pattern, for example, a blazed grating having a saw-tooth cross section, a binary grating having a rectangular cross section, a holographic grating having a sinusoidal cross section, or the like can be used. The diffraction grating pattern is formed on the resin layer by, for example, nanoimprint lithography. The metal layer is, for example, a metal reflective film made of gold and is formed by vapor deposition. The period and depth of the grating grooves in the diffraction grating portion 314 are configured such that, for example, the diffraction efficiency is maximized with respect to the wavelength corresponding to the gain peak of the QCL element 2. Here, the diffraction efficiency means efficiency when light incident on the diffraction grating portion 314 is diffracted in the opposite direction on the same optical axis. It is preferable that the size of the diffraction grating portion 314 (mirror surface) is a size including a circular region of diameters from 1 mm to 15 mm from the viewpoint of realizing miniaturization of the laser module 1A.

The coil 315 is made of a metal material such as copper, and has a damascene structure embedded in a groove formed in the surface of the movable portion 313. The coil 315 is a drive coil through which a current for driving the movable diffraction grating 31 (that is, for swinging the movable portion 313) flows.

The magnet 32 generates a magnetic field (magnetic force) that acts on the coil 315. The magnet 32 is a neodymium magnet (permanent magnet) formed in a substantially rectangular parallelepiped shape.

The yoke 33 amplifies the magnetic force of the magnet 32 and forms a magnetic circuit together with the magnet 32. The surface of the yoke 33 is black-processed by, for example, zinc plating. The yoke 33 has an inclined surface 33a, a lower surface 33b, and a protruding portion 33c.

The inclined surface 33a is inclined with respect to the end surface 2b of the QCL element 2. Since the movable diffraction grating 31 is fixed on the inclined surface 33a, the normal direction of the diffraction grating portion 314 of the movable diffraction grating 31 may be inclined with respect to the end surface 2b. The inclination angle of the inclined surface 33a (the angle with respect to the end surface 2b of the QCL element 2) is set in accordance with the oscillation wave length of the QCL element 2, the number of grating grooves in the diffraction grating portion 314, the blazed angle, and the like.

The yoke 33 is formed in a substantially U-shape (inverted C-shape) when viewed from the Y-axis direction, and defines a layout space SP opened in the inclined surface 33a. The magnet 32 is disposed in the layout space SP, and the magnet 32 is accommodated in the yoke 33. The movable diffraction grating 31 is fixed to the inclined surface 33a at the edge portion of the support portion 311 so as to cover the opening of the layout space SP.

In the movable diffraction grating 31, when a current flows through the coil 315, a Lorentz force is generated in a predetermined direction in electrons flowing through the coil 315 by a magnetic field formed by the magnet 32 and the yoke 33. Thus, the coil 315 receives a force in a predetermined direction. Therefore, by controlling the direction or magnitude of the current flowing through the coil 315, the movable portion 313 (diffraction grating portion 314) can be swung around the axis A. In addition, the movable portion 313 can be swung at high speed at the level of the resonance frequencies (for example, at frequencies equal to or higher than 1 kHz) by causing currents having frequencies corresponding to the resonance frequencies of the movable portion 313 to flow through the coils 315.

[Configuration of First Holder]

Figure 6:
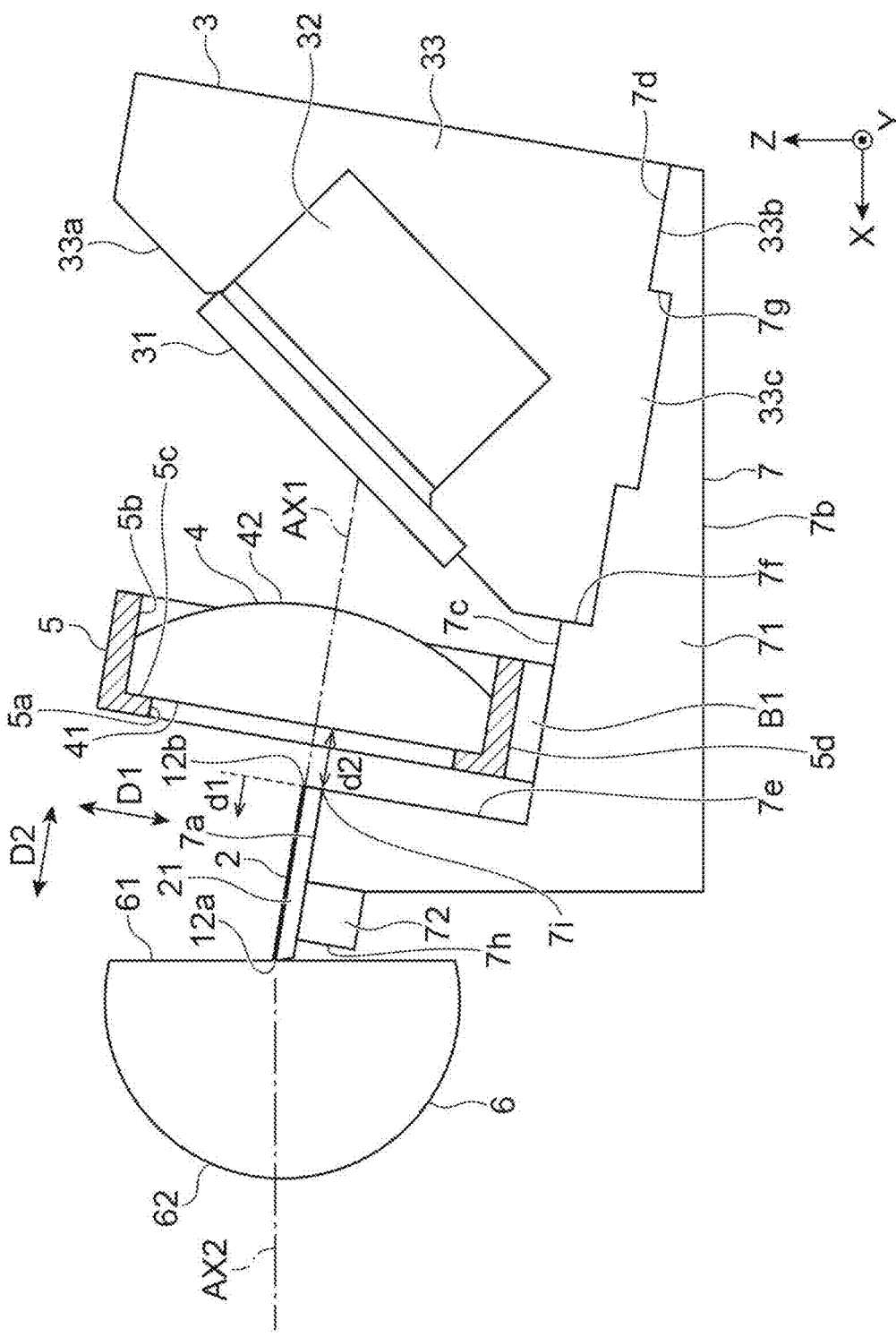
FIG. 6 is a side view illustrating an arrangement configuration of a first lens, a second lens, a quantum cascade laser element, a first holder, and a diffraction grating unit accommodated in a package.

Next, the configuration of the first holder 7 will be described with reference to FIGS. 3 and 6 mainly. The first holder 7 is a member that holds (supports) the QCL element 2 in the package 8. The first holder 7 also functions as a heat bath for suppressing heat generation of the QCL element 2 when the QCL element 2 is driven. The first holder 7 may be formed of, for example, a material having good thermal conductivity, capable of being precisely machined, and having sufficient hardness and rigidity for shape maintenance. The first holder 7 can be formed of, for example, a metal material such as copper tungsten similar to the bottom wall 81.

In the present embodiment, in addition to the QCL element 2, the first lens 4 (lens holder 5) and the diffraction grating unit 3 are also fixed to the first holder 7. That is, all members constituting an external resonator for oscillating the first light are supported by the first holder 7. According to the above-described configuration, before the QCL element 2, the first lens 4 (lens holder 5), and the diffraction grating unit 3 are housed in the package 8, these members can be fixed to the first holder 7 and position adjustment (positioning) between the members can be performed. That is, after the QCL element 2, the first lens 4 (lens holder 5), and the diffraction grating unit 3 are mounted on the first holder 7 while performing the above-described position adjustment, the first holder 7 can be accommodated in the package 8. Thus, the working efficiency can be improved as compared with the case where the position adjustment of each member is performed in the package 8.

The first holder 7 is fixed on the bottom wall 81 in the package 8. For example, the bottom surface 7b of the first holder 7 is fixed to the bottom wall 81 by an adhesive or the like. However, as described above, another member such as a Peltier element may be interposed between the first holder 7 and the bottom wall 81. Further, the first holder 7 may be attached to a portion (for example, the side wall 82) other than the bottom wall 81.

The first holder 7 has a support surface 7a on which the QCL element 2 is mounted, a support surface 7c on which the lens holder 5 is mounted, and a support surface 7d on which the diffraction grating unit 3 is mounted along the direction D2 in order from the side on which the second lens 6 is disposed. These support surfaces 7a, 7c and 7d are inclined so as to be parallel to the resonance direction (direction D2) of the external resonator. By disposing the respective members (the QCL element 2, the lens holder 5, and the diffraction grating unit 3) on the respective support surfaces 7a, 7c, and 7d which are inclined in this manner, it is possible to appropriately determine the positional relationship between the respective members constituting the external resonator. The support surface 7a is located at a position higher than the support surface 7c, and the support surface 7c is located at a position higher than the support surface 7d with reference to the upper surface of the bottom surface 81. A step is formed between the support surface 7a and the support surface 7c, and a step is formed between the support surface 7c and the support surface 7d.

The first holder 7 has a side surface 7e (first side surface) connecting the support surface 7a and the support surface 7c, and a side surface 7f connecting the support surface 7c and the support surface 7d. The side surfaces 7e and 7f are perpendicular to the direction D2. The side surface 7e is a surface facing the first lens 4 (lens holder 5) in the direction D2. The lens holder 5 is mounted on the support surface 7c so as to be spaced apart from the side surface 7e. The side surface 7f comes into contact with the side surface of the yoke 33 on the lens holder 5 side and has a function of positioning the yoke 33. A concave portion 7g into which the protruding portion 33c provided in the lower surface 33b of the yoke 33 is inserted is formed in the support surface 7d. The diffraction grating unit 3 is fixed to the support surface 7d by fitting the protruding portion 33c into the concave portion 7g.

Further, the bottom surface 5d of the lens holder 5 is fixed to the support surface 7c via the adhesive layer B1. The adhesive layer B1 is made of, for example, photo-curable resins. The lens holder 5 is fixed to the support surface 7c so that the optical axis AX1 of the first lens 4 and the resonance axis of the QCL element 2 (optical axis of mid-infrared light emitted from the end surface 12b) coincide with each other. For example, the height position of the lens holder 5 with respect to the support surface 7c can be finely adjusted by adjusting the amount of the adhesive layer B1, the strength with which the lens holder 5 is pressed against the adhesive layer B1, or the like. However, the method of fixing the lens holder 5 to the support surface 7c is not limited to the above. For example, the lens holder 5 may be fixed to the support surface 7c by screwing or the like.

Mid-infrared light having a relatively large spread angle is emitted from an end surface (end surface 12b) on the first lens 4 side of the QCL element 2. Therefore, from the viewpoint of preventing the mid-infrared light from being blocked by the first holder 7 (mainly the support surface 7a) to avoid a decrease in the coupling efficiency of the external resonator, the laser module 1A is configured as follows. That is, when viewed from the Y-axis direction (direction perpendicular to the direction D1 and the direction D2), if the direction from the first lens 4 to the QCL element 2 along the direction D2 is defined as the positive direction, the distance d1 (first distance) from the intersection point 7i of the side surface 7a and the support surface 7e to the end surface 12b along the direction D2 is smaller than the distance d2 (second distance) between the intersection point 7i and the first lens 4 (the first lens surface 41) along the direction D2. In the present embodiment, the end surface 2b of the QCL element 2 including the end surface 12b of the active layer 12 is flush with the side surface 7e. That is, the distance d1 is 0. When the end surface 2b is located closer to the second lens 6 than the intersection point 7i in the direction D2, the distance d1 is larger than 0. When the end surface 2b protrudes to the first lens 4 further than the intersection point 7i in the direction D2, the distance d1 is smaller than 0. When the first lens surface 41 is a non-flat surface (i.e., when the distance between the intersection point 7i and the first lens surface 41 varies along the Y-axis direction), the distance d2 is the minimum distance between the intersection point 7i and the first lens surface 41 (i.e., the distance between the intersection point 7i and a portion of the first lens surface 41 closest to the intersection point 7i along the direction D2).

The first holder 7 has a side surface 7h (second side surface) that is connected to the support surface 7a and faces the light incident surface 61 of the second lens 6 in the direction D2. The end surface 2a on the second lens 6 side of the QCL element 2 (end surface including the end surface 12a of the active layer 12) is located closer to the second lens 6 than the side surface 7h in the direction D2. According to the above configuration, the end surface 12a of the QCL element 2 protrudes to the second lens 6 further than the side surface 7h of the first holder 7, and thus the end surface 12a of the QCL element 2 can be brought into contact with or close to the second lens 6 for terahertz wave output while suppressing interference between the first holder 7 and the second lens 6.

In the present embodiment, the first holder 7 has a main body portion 71 including a portion 71a (see FIG. 7) on the first lens 4 side in the support surface 7a and a side surface 7e, and a protruding portion 72 connected to the main body portion 71. In the present embodiment, as shown in FIG. 7, the protruding portion 72 is a portion formed in a tapered shape toward the second lens 6 in plan view. The protruding portion 72 includes a portion 72a on the second lens 6 side in the support surface 7a and includes the above-described side surface 7h.

As shown in FIG. 3, the end surface 12a of the active layer 12 of the QCL element 2 is located inside the small-diameter hole 85a of the side wall 822. According to the above-described configuration, the end surface 12a of the QCL element 2 is advanced to the inside of the small-diameter hole 85a, and the substrate 21 of the QCL element 2 can be brought into contact with or close to (in contact with in the present embodiment) the light incident surface 61 of the second lens 6. As a result, the extraction efficiency of the terahertz wave L1 can be improved and the entire package can be miniaturized. More specifically, by bringing the QCL element 2 and the second lens 6 close to each other, the size of the second lens 6 necessary for collimating the terahertz wave L1 can be reduced, and thus the entire laser module 1A can be reduced in size.

Further, at least a portion of the protruding portion 72 described above is located inside the small-diameter hole 85a. That is, the protruding portion 72 is partially inserted into the small-diameter hole 85a. According to the above configuration, by extending the first holder 7 (protruding portion 72) to the inside of the small-diameter hole 85a, the contact surface between the QCL element 2 and the first holder 7 (support surface 7a) can be increased. As a result, the heat dissipation efficiency from the QCL element 2 to the first holder 7 can be increased.

In addition, a first width of the protruding portion 72 in a width direction (i.e., Y-axis direction (fourth direction)) perpendicular to the direction D1 and direction D2 is smaller than that of the main body portion 71 in the width direction. As shown in FIG. 7, the protruding portion 72 is formed in such a shape that the protruding portion 72 becomes gradually narrower toward the second lens 6 along the direction D2. In the present embodiment, as an example, the protruding portion 72 is formed in a tapered shape that tapers off in plan view. According to the above configuration, by making the width of the protruding portion 72 smaller than the width of the main body portion 71, it is possible to secure the volume of the first holder 7 that functions as a heat bath while preventing interference between the first holder 7 and the package 8 (side wall 822). By forming the protruding portion 72 in a tapered shape as described above, it is possible to effectively reduce the risk of interference (contact) between the protruding portion 72 and the side wall 822 (mainly the inner surface of the small-diameter hole 85a) when the first holder 7 on which the QCL element 2 is mounted is housed and positioned in the package 8.

The laser module 1A is manufactured in the following manner, for example. First, the second lens 6 is attached to the through hole 85 of the package 8 before the top wall 83 is attached. Subsequently, the QCL element 2, the first lens 4 (lens holder 5), and the diffraction grating unit 3 are attached to the first holder 7 outside the package 8. At this time, the positions of the QCL element 2, the first lens 4 (lens holder 5), and the diffraction grating unit 3 are adjusted so that the resonance axis of the QCL element 2 and the optical axis AX1 of the first lens 4 coincide with each other and the optical axis AX1 passes through the center of the diffraction grating portion 314. Subsequently, the first holder 7 on which the respective members are mounted as described above is housed in the package 8. The first holder 7 is fixed in the package 8 so that a part of the side surface 21c of the substrate 21 of the QCL element 2 is in contact with (or close to) the approximate center position of the light incident surface 61 of the second lens 6. Next, among the members housed in the package 8, members that require electrode supply (such as the QCL element 2) And an electrode terminal (lead terminal 9) are electrically connected by a wire or the like (not shown). After the arrangement of each member in the package 8 and the wiring process are completed, the inside of the package 8 is evacuated or nitrogenated, and the top wall 83 is airtightly joined to the end portion 82a of the side wall 82 on the side opposite to the bottom wall 81 side. As described above, the above-described laser module 1A is obtained.

In the above-described laser module 1A, a configuration for oscillating the first light and the second light necessary for generating a terahertz wave L1 by generating a difference frequency, that is, the QCL element 2, the first holder 7 holding the QCL element 2, the movable diffraction grating 31 (diffraction grating unit 3), and the first lens 4 are packaged. When viewed from the Y-axis direction, the distance d1 ("0" in the present embodiment) from the intersection point 7*i* between the side surface 7*e* and the support surface 7*a* of the first holder 7 to the end surface 12*b* along the direction D2 when the direction from the first lens 4 to the QCL element 2 along the direction D2 (i.e., resonance direction) in which both end surfaces (end surface 12*a* and end surface 12*b*) of the QCL element 2 face each other is defined as positive direction is smaller than the distance d2 between the intersection point 7*i* and the first lens 4 (first lens surface 41) along the direction D2 (see FIG. 6). Here, when the distance from the end surface 12*b* from which the mid-infrared light is emitted to the first lens 4 (first lens surface 41) becomes long, the size of the first lens 4 (first lens surface 41) necessary for causing a sufficient amount of mid-infrared light having a spread angle to be incident becomes large. In addition, since the range of the mid-infrared light collimated by the first lens 4 also increases accordingly, it is necessary to increase the area of the movable diffraction grating 31 (diffraction grating portion 314) receiving the collimated mid-infrared light by that amount. As a result, the movable diffraction grating 31 is also enlarged. On the other hand, by arranging the QCL element 2 and the first holder 7 in this manner, the QCL element 2 (end surface 12*b*) can be brought as close as possible to the first lens 4. Accordingly, it is possible to suppress an increase in size of the first lens 4 and the movable diffraction grating 31, and to reduce the size of the entire package 8. In addition, by setting the distance d1 to be small as described above, it is possible to suppress interference between the emitted light (mid-infrared light) from the end surface 12*b* and the first holder 7 (that is, a part of the emitted light is blocked by the first holder 7 and does not reach the first lens 4). As a result, the loss of light contributing to the generation of terahertz waves can be reduced. As described above, it is possible to obtain the laser module 1A which is packaged in a form in which miniaturization is achieved and loss of light contributing to generation of terahertz wave can be suppressed. For example, it is possible to obtain a laser module 1A aggregated to a size within the 10000 mm³. In the laser module 1A, a current equal to or greater than a threshold value is injected into the QCL element 2, and the angle of the movable diffraction grating 31 is changed by external control, thereby obtaining a single-mode and wavelength-variable terahertz wave L1.

In addition, in the laser module 1A, the distance d1 may be 0 or less. According to the above-described configuration (the configuration of the present embodiment) in which the end surface 12*b* is flush with the side surface 7*h* or the configuration in which the end surface 12*b* protrudes from the side surface 7*h* toward the first lens 4, interference between light emitted from the end surface 12*b* and the first holder 7 can be more reliably prevented, and thus the loss of light contributing to the generation of terahertz waves can be more effectively reduced.

Furthermore, according to the configuration in which the distance d1 is equal to 0 as in the present embodiment (that is, the end surface 12*b* and the side surface 7*h* are flush with each other), the entire portion extending to the end surface 12*b* of the QCL element 2 can be brought into contact with the first holder 7 (support surface 7*a*), and thus heat dissipation efficiency from the QCL element 2 to the first holder 7 can be increased.

Second Embodiment

A laser module 1B according to the second embodiment will be described with reference to FIGS. 8 and 9. In FIG.

9, the top wall 83, the protruding wall 84, and the lead terminals 9 are not shown in order to easily understand the positional relationship of the main members housed in the package 8.

The laser module 1B is different from the laser module 1A mainly in that a lens for outputting a terahertz wave (second lens 6) is accommodated in the package 8. The laser module 1B includes a second holder 100 that holds the second lens 6 inside the package 8. That is, in the laser module 1B, the second lens 6 and the second holder 100 are accommodated in the package 8. Instead of the second lens 6, a light exit window 200, which is a window material different from the second lens 6, is provided in the through hole 85 of the side wall 822.

The second holder 100 has a substantially rectangular parallelepiped outer shape. The second holder 100 is fixed on the bottom wall 81 by a fixing resin, an adhesive, screwing, or the like between the side wall 822 provided with the through hole 85 and the first holder 7. However, the shape and fixing method of the second holder 100 are not limited to those described above. For example, the second holder 100 may be fixed to the side wall 82 (for example, a pair of side walls 821 located on both sides of the second holder 100) instead of the bottom wall 81. The second holder 100 may be formed of, for example, a material that can be precisely machined and has sufficient hardness and rigidity for shape maintenance. The second holder 100 may be formed of, for example, a metal such as aluminum, stainless steel, or copper, or a hard plastic.

The second holder 100 is provided with a through hole 101 penetrating in a direction perpendicular to the side wall 822 (i.e., X-axis direction (third direction)). A second lens 6 is attached to the through hole 101. The through hole 101 has a small-diameter hole 101*a* (first hole portion), a large-diameter hole 101*b* (second hole portion), and a counterbore surface 101*c*. The small-diameter hole 101*a* is open toward the QCL element 2 in the optical axis direction (that is, the X-axis direction) of the second lens 6. The large-diameter hole 101*b* is open toward the side wall 822 where the through hole 85 is provided in the X-axis direction. The large-diameter hole 101*b* includes the small-diameter hole 101*a* and has a shape larger than the small-diameter hole 101*a* when viewed from the X-axis direction. The small-diameter hole 101*a* and the large-diameter hole 101*b* each extend in the X-axis direction. In the present embodiment, each of the small-diameter hole 101*a* and the large-diameter hole 101*b* is formed in a circular shape, and a diameter of the large-diameter hole 101*b* is larger than that of the small-diameter hole 101*a*. As an example, the central axes of the small-diameter hole 101*a* and the large-diameter hole 101*b* substantially coincide with the optical axis AX2 (see FIG. 6) of the second lens 6.

The counterbore surface 101*c* is an annular surface that connects the small-diameter hole 101*a* and the large-diameter hole 101*b* and extends along a plane (YZ plane) intersecting the X-axis direction. More specifically, the counterbore surface 101*c* connects an end portion of the small-diameter hole 101*a* on a side facing the large-diameter hole 101*b* and an end portion of the large-diameter hole 101*b* on a side facing the small-diameter hole 101*a*. The large-diameter hole 101*b* and the counterbore surface 101*c* can be formed by counterboring the second holder 100 from the side opposite to the QCL element 2 side of the second holder 100. Although the counterbore surface 101*c* is formed in a continuous annular shape in the present embodiment, the counterbore surface 101*c* may be formed in a discontinuous annular shape. For example, a cutout may be formed in a portion of the inner surface of the small-diameter hole 101*a*, and the counterbore surface 101*c* may be divided at the portion where the cutout is formed. A through hole 101 penetrating in the X-axis direction is formed by the small-diameter hole 101*a* and the large-diameter hole 101*b* connected by the counterbore surface 101*c*.

An outer edge portion of the light incident surface 61 of the second lens 6 is inserted into the large-diameter hole 101*b* from the side wall 822 side where the through hole 85 is provided, and is fixed in surface contact with the counterbore surface 101*c*. The outer edge of the light incident surface 61 is secured to the counterbore surface 101*c* by, for example, a fixing plastic, adhesive, or the like. According to the above configuration, since the second lens 6 for terahertz wave output can be attached to the second holder 100 from the outside of the second holder 100 (the side opposite to the side on which the QCL element 2 is disposed), the attachment work for the second lens 6 can be easily performed.

The height position of the through hole 101 in the second holder 100 is set such that the optical axis AX2 of the second lens 6 attached to the through hole 101 and the center of the light exit window 200 provided in the through hole 85 substantially coincide with each other (i.e., coincide within the range of mechanical accuracy).

Figure 8:
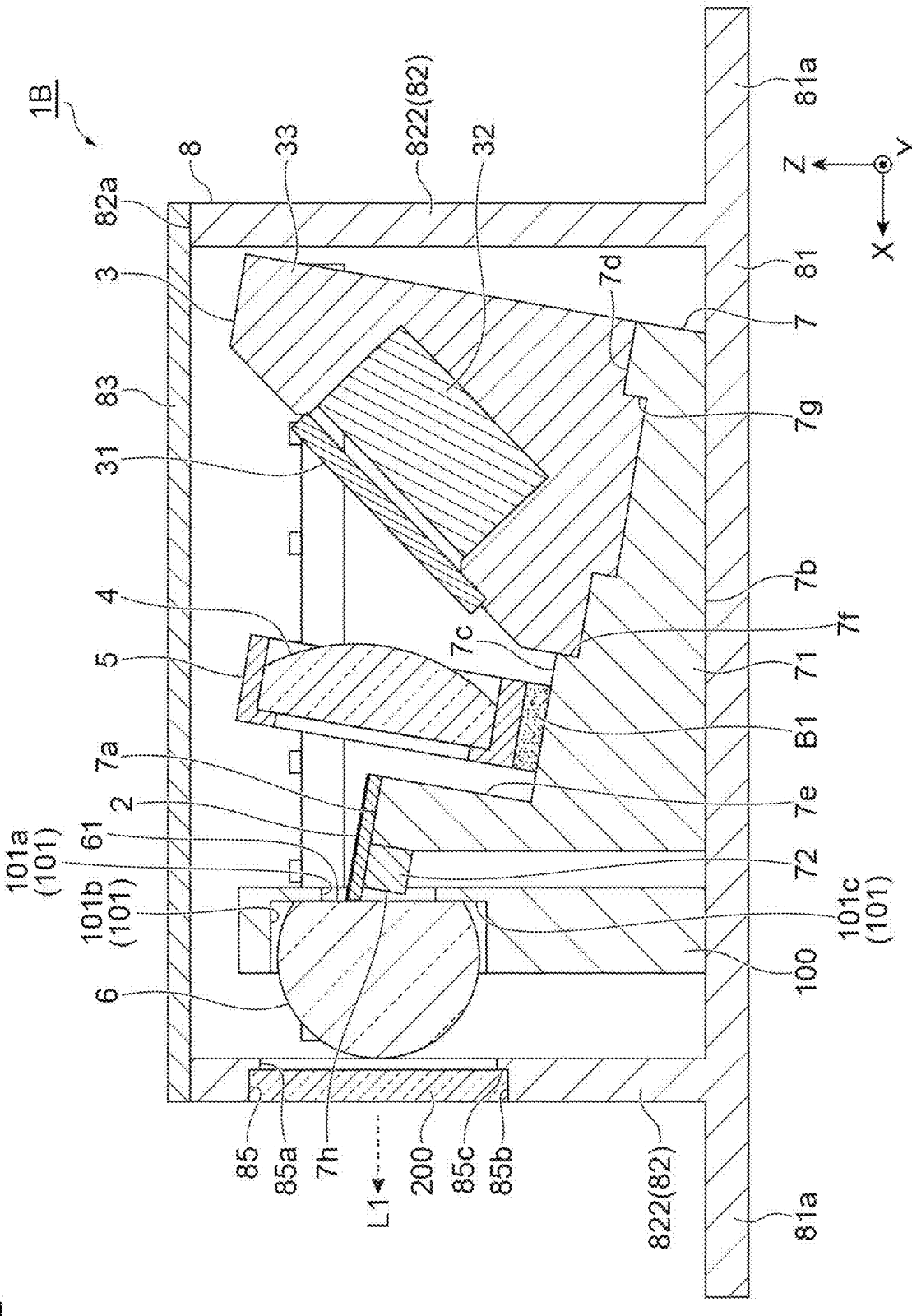
FIG. 8 is a cross-sectional view of a laser module of the second embodiment.
Figure 9:
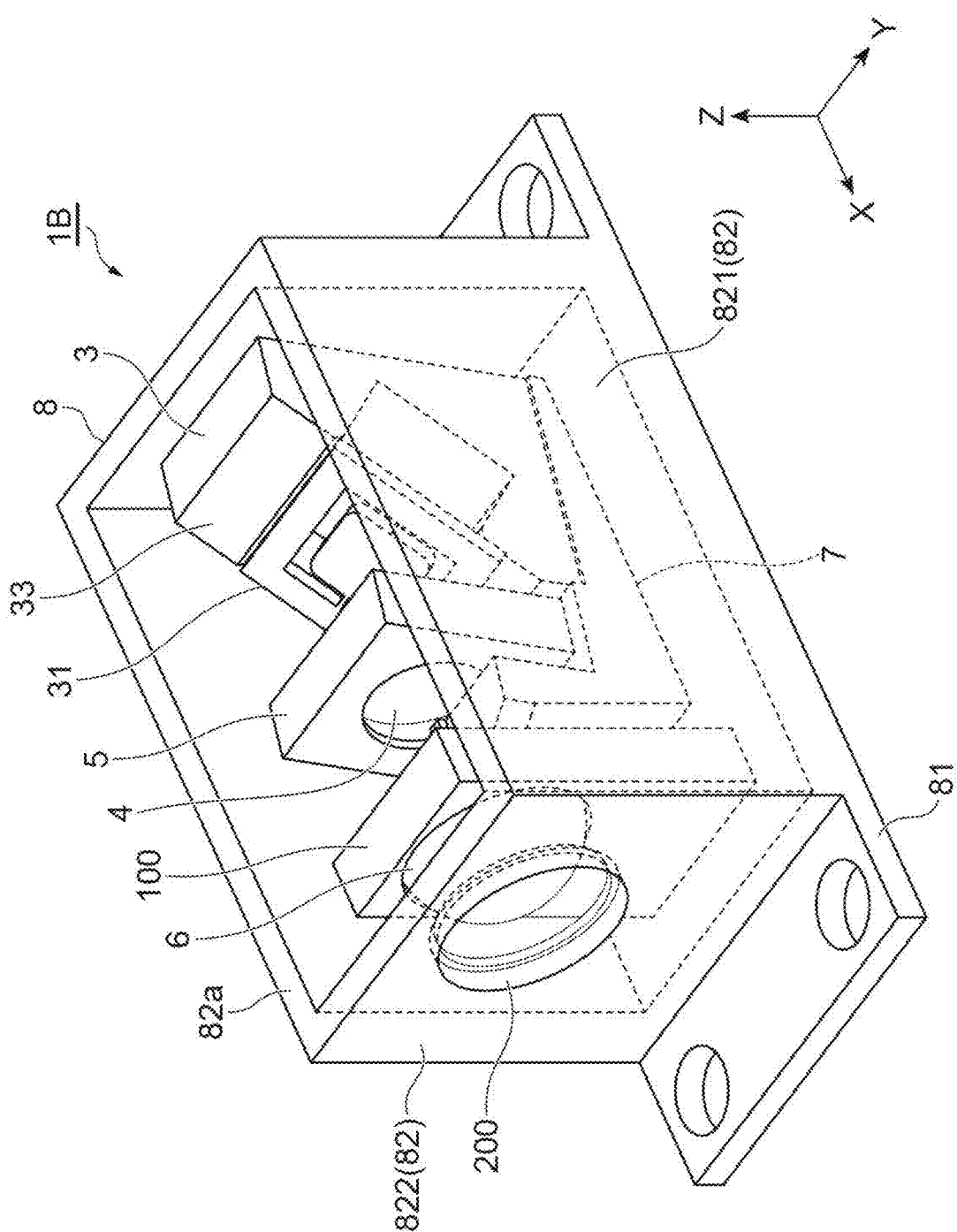
FIG. 9 is a schematic perspective view of the laser module of the second embodiment.

In the example of FIGS. 8 and 9, the height (length in the Z-axis direction) and the width (length in the Y-axis direction) of the second holder 100 are smaller than the dimensions (height and width) inside the package 8, but the height and width of the second holder 100 may be provided so as to substantially match the dimensions inside the package 8. That is, the second holder 100 may be configured to partition the package 8 into a first space closer to the side wall 822 where the through hole 85 is provided than the second holder 100 and a second space closer to the QCL element 2 than the second holder 100. Thus, the second holder 100 can prevent a scattered component (a component that does not contribute to external resonance) of mid-infrared light generated in the second space from entering the first space due to reflection or the like in the package 8. As a result, it is possible to suppress the occurrence of the scattering component (stray light) emitted to the outside of the package 8 through the light exit window 200.

The light exit window 200 is formed in, for example, a disk shape. The light exit window 200 is attached to the through hole 85 in the same manner as the second lens 6 in the first embodiment, for example. That is, the outer edge portion of the surface of the light exit window 200 on the side wall 822 side is inserted into the large-diameter hole 85*b* from the outside of the package 8 and fixed in surface contact with the counterbore surface 85*c*. The light exit window 200 is sealed to the counterbore surface 85*c* so as to keep the inside of the package 8 airtight. The light exit window 200 is formed of an arbitrary material that transmits terahertz waves, such as silicon, Tsurupica, or polyethylene. Both surfaces (outer surface and inner surface) of the light exit window 200 may be provided with a low reflective coating to reduce reflection of terahertz waves.

According to the laser module 1B described above, since the second lens 6 for outputting a terahertz wave can be accommodated in the package in the same manner as the first lens 4, it is possible to prevent the second lens 6 from being damaged and contaminated.

Further, in the laser module 1B, the second holder 100 is a separate member from the first holder 7 and is fixed to the package 8 independently of the first holder 7. According to the above-described configuration, since the first holder 7 and the second holder 100 are independent of each other, the work of attaching the QCL element 2 or the like to the first holder 7 and the work of attaching the second lens 6 to the second holder 100 can be performed in parallel before each member is housed in the package 8. As a result, it is possible to improve the work efficiency of assembling the laser module 1B.

In addition, in the laser module 1B, similarly to the laser module 1A, the end surface 12*a* of the active layer 12 of the QCL element 2 is located inside the small-diameter hole 101*a* of the second holder 100. According to the above-described configuration, the end surface 12*a* of the QCL element 2 is advanced to the inside of the small-diameter hole 101*a*, and the substrate 21 of the QCL element 2 can be brought into contact with or close to (in contact with in the present embodiment) the light incident surface 61 of the second lens 6. As a result, the extraction efficiency of the terahertz wave L1 can be improved and the entire package can be miniaturized.

Further, at least a part of the protruding portion 72 of the first holder 7 is located inside the small-diameter hole 101*a* of the second holder 100. According to the above configuration, by extending the first holder 7 (protruding portion 72) to the inside of the small-diameter hole 101*a*, the contact surface between the QCL element 2 and the first holder 7 (support surface 7*a*) can be increased. As a result, the heat dissipation efficiency from the QCL element 2 to the first holder 7 can be increased.

Third Embodiment

Figure 10:
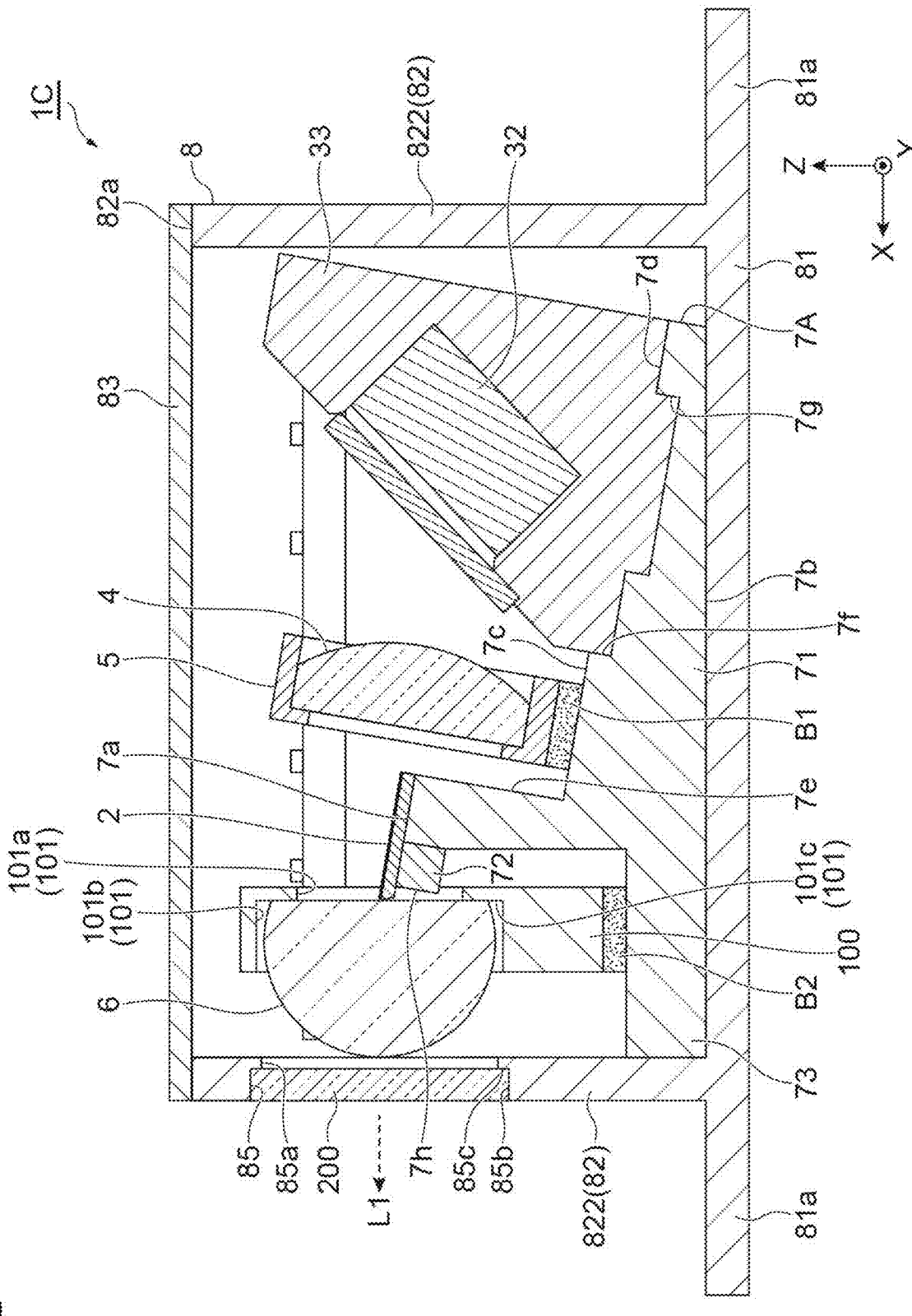
FIG. 10 is a cross-sectional view of a third embodiment laser module.
Figure 11:
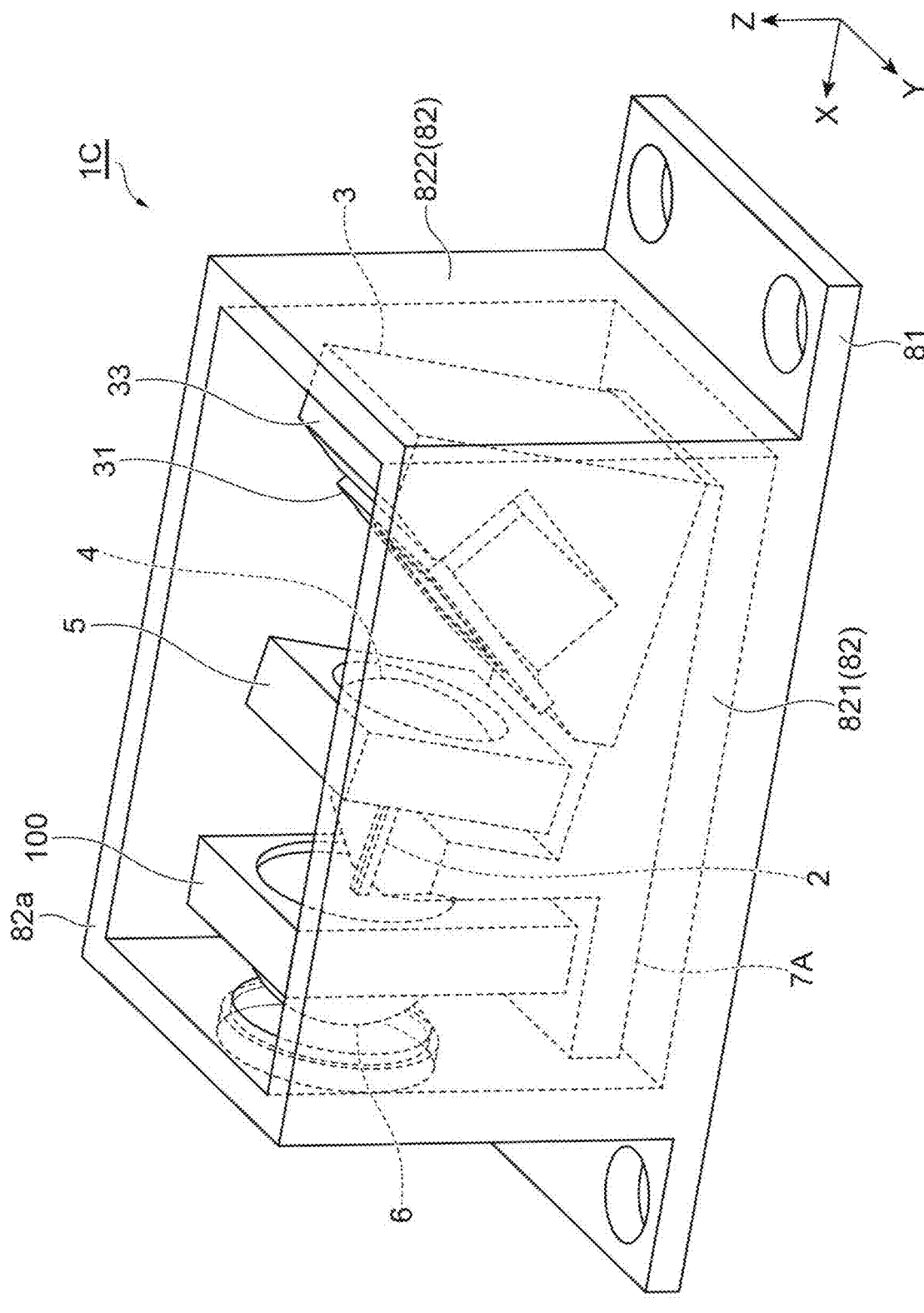
FIG. 11 is a schematic perspective view of the laser module of the third embodiment.

A laser module 1C according to the third embodiment will be described with reference to FIGS. 10 and 11. In FIG. 11, the top wall 83, the protruding wall 84, and the lead terminals 9 are not shown in order to easily understand the positional relationship of the main members housed in the package 8.

The laser module 1C differs from the laser module 1B mainly in that the second holder 100 is fixed to the first holder. The laser module 1C has a first holder 7A instead of the first holder 7. The first holder 7A is different from the first holder 7 in that it has an extending portion 73 extending along the bottom wall 81 from the lower portion of the main body portion 71 of the first holder 7 toward the side wall 822 provided with the through hole 85. The second holder 100 is fixed on the extending portion 73 by an adhesive, a fixing resin, screwing, or the like. In the present embodiment, as an example, the second holder 100 is fixed to the upper surface of the extending portion 73 via an adhesive layer B2. The adhesive layer B2 is, for example, a photo-curable material similar to the adhesive layer B1.

In the laser module 1C, in addition to the QCL element 2, the first lens 4 (lens holder 5) and the diffraction grating unit 3 are fixed with respect to the first holder 7A as in the first embodiment and the second embodiment. Further, the second holder 100 is fixed to the first holder 7A (extending portion 73). According to the above-described configuration, since a structure in which the first holder 7A and the second holder 100 are integrated can be prepared outside the package 8, the positions of the QCL element 2, the first lens 4 (lens holder 5), the diffraction grating unit 3, and the second lens 6 can be adjusted outside the package 8. Thus, the work efficiency can be improved as compared with the case where the position adjustment is performed in the package 8. More specifically, an adjustment of the external resonator, and subsequent positioning of a holder (a combination of the first holder 7A and the second holder 100) for emitting the terahertz wave L1 in a desired direction while bringing the end surface (a part of the side surface 21c of the substrate 21) of the QCL element 2 into contact with (or close to) the light incident surface 61 of the lens (second lens 6) for outputting the terahertz wave can be performed outside the package 8. As a result, it is possible to release the restriction of the work space when performing the alignment of each member accommodated in the package 8, and to improve the efficiency and accuracy of the alignment work. Note that the second holder 100 may be formed integrally with the first holder 7A. In this case, a member (adhesive layer B2 in the present embodiment) for attaching the second holder 100 to the first holder 7A is unnecessary.

In addition, in the laser module 1C, when a temperature control element such as a Peltier element is disposed between the first holder 7A and the bottom wall 81, the contact areas between the first holder 7A and the temperature control element can be increased by the extending portion 73. Thus, the heat dissipation efficiency can be improved compared to the case where the first holder 7 is used.

[Modification]

Although some embodiments of the present disclosure have been described above, the present disclosure is not limited to the above embodiments. The material and shape of each component are not limited to those described above, and various materials and shapes may be employed. Some configurations included in the laser modules 1A, 1B, and 1C according to the above-described embodiments may be omitted or changed as appropriate. For example, according to the above-described embodiment, it is possible to reduce the size of the laser modules 1A, 1B, and 1C as described above. However, the laser modules 1A, 1B, and 1C are not necessarily limited to those reduced to a size equal to or smaller than the hand-top size. In addition, the type of package 8 is not limited to a butterfly package.

What is claimed is:

1. A laser module comprising:
a quantum cascade laser that includes:
    a substrate having a main surface and a back surface opposite to the main surface;
    a first clad layer provided on the main surface;
    an active layer provided on an opposite side of the first clad layer to the substrate; and
    a second clad layer provided on an opposite side of the active layer to the first clad layer,
    wherein the active layer has a first end surface and a second end surface facing each other in a second direction orthogonal to a first direction that corresponds to a stacking direction of the substrate, the first clad layer, the active layer, and the second clad layer,
    the first end surface constitutes a resonator for oscillating light of a first frequency and light of a second frequency, and
    the active layer generates a terahertz wave having a difference frequency between the first frequency and the second frequency;
a diffraction grating unit that includes a movable diffraction grating constituting an external resonator for the light of the first frequency;
a first lens disposed between the quantum cascade laser element and the movable diffraction grating and configured to transmit light emitted from the second end surface and light returning from the movable diffraction grating to the quantum cascade laser element;

a second lens disposed at a position facing the first end surface and configured to transmit the terahertz wave emitted from the quantum cascade laser element;
a first holder configured to hold the quantum cascade laser element; and
a package that accommodates the quantum cascade laser element, the diffraction grating unit, the first lens, and the first holder and in which an optical path between a light incident surface of the second lens and the movable diffraction grating is disposed,
wherein the first holder includes:
    a support surface on which the quantum cascade laser element is mounted; and
    a first side surface connected to the support surface and facing the first lens in the second direction,
when viewed from a direction orthogonal to the first direction and the second direction, a first distance from an intersection point between the first side surface and the support surface to the second end surface along the second direction when a direction from the first lens toward the quantum cascade laser element along the second direction is a positive direction is smaller than a second distance between the intersection point and the first lens along the second direction,
the first holder has a second side surface connected to the support surface and facing the second lens in the second direction,
the first end surface is located closer to the second lens than the second side surface in the second direction, and
the second end surface is located closer to the first lens than the first side surface in the second direction.

2. The laser module according to claim 1, wherein the first distance is less than or equal to 0.

3. The laser module according to claim 1, wherein the first distance is 0.

4. The laser module according to claim 1, wherein
a resonance axis passing through the first end surface and the second end surface in the quantum cascade laser element intersects an optical axis of the second lens by the support surface being inclined such that the support surface intersects the optical axis of the second lens, and
the first end surface is spaced apart from the light incident surface of the second lens.

5. The laser module according to claim 1, wherein the first lens and the diffraction grating unit are fixed to the first holder.

6. The laser module according to claim 1, wherein the second lens is a hemispherical or super-hemispherical silicon lens.

7. The laser module according to claim 1, wherein
the package has a side wall facing the first end surface,
the side wall has a through hole penetrating in a third direction perpendicular to the side wall,
the through hole includes:
    a first hole portion that opens to an inside of the package;
    a second hole portion that opens to an outside of the package, and that includes the first hole portion and is larger than the first hole portion when viewed from the third direction; and
    an annular counterbore surface connecting the first hole portion and the second hole portion and extending along a plane intersecting the third direction, and
an outer edge portion of the light incident surface of the second lens is inserted into the second hole portion from the outside of the package and is fixed in surface contact with the counterbore surface.

8. The laser module according to claim 7, wherein the first end surface is located inside the first hole portion.

9. The laser module according to claim 1, further comprising a second holder configured to hold the second lens, wherein the second lens and the second holder are accommodated in the package, the package has a side wall facing the first end surface, and the side wall is provided with a light exit window for transmitting light that is emitted from the first end surface and passes through the second lens.

10. The laser module according to claim 9, wherein the second holder is fixed to the package independently of first holder.

11. The laser module according to claim 9, wherein
the first lens and the diffraction grating unit are fixed to the first holder, and
the second holder is integrally formed with the first holder or is fixed to the first holder.

12. The laser module according to claim 9, wherein
the second holder has a through hole penetrating in a third direction perpendicular to the side wall,
the through hole includes:
a first hole portion that opens toward the quantum cascade laser element;
a second hole portion that opens toward the side wall, and that includes the first hole portion and is larger than the first hole portion when viewed from the third direction; and
an annular counterbore surface connecting the first hole portion and the second hole portion and extending along a plane intersecting the second direction, and
an outer edge portion of the light incident surface of the second lens is inserted into the second hole portion from a side wall side and is fixed in surface contact with the counterbore surface.

13. The laser module according to claim 12, wherein the first end surface is located inside the first hole portion.

14. A laser module comprising:
a quantum cascade laser that includes:
a substrate having a main surface and a back surface opposite to the main surface;
a first clad layer provided on the main surface;
an active layer provided on an opposite side of the first clad layer to the substrate; and
a second clad layer provided on an opposite side of the active layer to the first clad layer,
wherein the active layer has a first end surface and a second end surface facing each other in a second direction orthogonal to a first direction that corresponds to a stacking direction of the substrate, the first clad layer, the active layer, and the second clad layer,
the first end surface constitutes a resonator for oscillating light of a first frequency and light of a second frequency, and
the active layer generates a terahertz wave having a difference frequency between the first frequency and the second frequency;
a diffraction grating unit that includes a movable diffraction grating constituting an external resonator for the light of the first frequency;
a first lens disposed between the quantum cascade laser element and the movable diffraction grating and configured to transmit light emitted from the second end surface and light returning from the movable diffraction grating to the quantum cascade laser element;
a second lens disposed at a position facing the first end surface and configured to transmit the terahertz wave emitted from the quantum cascade laser element;
a first holder configured to hold the quantum cascade laser element; and
a package that accommodates the quantum cascade laser element, the diffraction grating unit, the first lens, and the first holder and in which an optical path between a light incident surface of the second lens and the movable diffraction grating is disposed,
wherein the first holder includes:
a support surface on which the quantum cascade laser element is mounted; and
a first side surface connected to the support surface and facing the first lens in the second direction,
when viewed from a direction orthogonal to the first direction and the second direction, a first distance from an intersection point between the first side surface and the support surface to the second end surface along the second direction when a direction from the first lens toward the quantum cascade laser element along the second direction is a positive direction is smaller than a second distance between the intersection point and the first lens along the second direction,
the package has a side wall facing the first end surface,
the side wall has a through hole penetrating in a third direction perpendicular to the side wall,
the through hole includes:
a first hole portion that opens to an inside of the package;
a second hole portion that opens to an outside of the package, and that includes the first hole portion and is larger than the first hole portion when viewed from the third direction; and
an annular counterbore surface connecting the first hole portion and the second hole portion and extending along a plane intersecting the third direction,
an outer edge portion of the light incident surface of the second lens is inserted into the second hole portion from the outside of the package and is fixed in surface contact with the counterbore surface,
the first end surface is located inside the first hole portion, and
the first holder further includes:
a main body portion that includes a portion located closer to the first lens in the support surface and the first side surface; and
a protruding portion connected to the main body portion and including a portion located closer to the second lens in the support surface, and
at least a portion of the protruding portion is located inside the first hole portion.

15. The laser module according to claim 14, wherein
a width of the protruding portion in a fourth direction orthogonal to the first direction and the second direction is smaller than a width of the main body portion in the third direction.

16. The laser module according to claim 15, wherein the protruding portion is formed in a shape in which the width of the protruding portion gradually decreases toward the second lens along the second direction.

17. A laser module comprising:
a quantum cascade laser that includes:

a substrate having a main surface and a back surface opposite to the main surface;

a first clad layer provided on the main surface;

an active layer provided on an opposite side of the first clad layer to the substrate; and a second clad layer provided on an opposite side of the active layer to the first clad layer, wherein the active layer has a first end surface and a second end surface facing each other in a second direction orthogonal to a first direction that corresponds to a stacking direction of the substrate, the first clad layer, the active layer, and the second clad layer, the first end surface constitutes a resonator for oscillating light of a first frequency and light of a second frequency, and the active layer generates a terahertz wave having a difference frequency between the first frequency and the second frequency;

a diffraction grating unit that includes a movable diffraction grating constituting an external resonator for the light of the first frequency;

a first lens disposed between the quantum cascade laser element and the movable diffraction grating and configured to transmit light emitted from the second end surface and light returning from the movable diffraction grating to the quantum cascade laser element;

a second lens disposed at a position facing the first end surface and configured to transmit the terahertz wave emitted from the quantum cascade laser element;

a first holder configured to hold the quantum cascade laser element; and a package that accommodates the quantum cascade laser element, the diffraction grating unit, the first lens, and the first holder and in which an optical path between a light incident surface of the second lens and the movable diffraction grating is disposed, wherein the first holder includes:

a support surface on which the quantum cascade laser element is mounted; and a first side surface connected to the support surface and facing the first lens in the second direction, when viewed from a direction orthogonal to the first direction and the second direction, a first distance from an intersection point between the first side surface and the support surface to the second end surface along the second direction when a direction from the first lens toward the quantum cascade laser element along the second direction is a positive direction is smaller than a second distance between the intersection point and the first lens along the second direction, the laser module further comprising a second holder configured to hold the second lens, the second lens and the second holder are accommodated in the package, the package has a side wall facing the first end surface, the side wall is provided with a light exit window for transmitting light that is emitted from the first end surface and passes through the second lens, the second holder has a through hole penetrating in a third direction perpendicular to the side wall, the through hole includes:

a first hole portion that opens toward the quantum cascade laser element;

a second hole portion that opens toward the side wall, and that includes the first hole portion and is larger than the first hole portion when viewed from the third direction; and an annular counterbore surface connecting the first hole portion and the second hole portion and extending along a plane intersecting the second direction, an outer edge portion of the light incident surface of the second lens is inserted into the second hole portion from a side wall side and is fixed in surface contact with the counterbore surface, the first end surface is located inside the first hole portion, and the first holder further includes:

a main body portion that includes a portion located closer to the first lens in the support surface and the first side surface; and a protruding portion connected to the main body portion and including a portion located closer to the second lens in the support surface, and at least a portion of the protruding portion is located inside the first hole portion.

18. The laser module according to claim 17, wherein a width of the protruding portion in a fourth direction orthogonal to the first direction and the second direction is smaller than a width of the main body portion in the third direction.

19. The laser module according to claim 18, wherein the protruding portion is formed in a shape in which the width of the protruding portion gradually decreases toward the second lens along the second direction.

\* \* \* \* \*